(12) United States Patent
Zhang et al.

(10) Patent No.: US 6,635,521 B2
(45) Date of Patent: *Oct. 21, 2003

(54) CMOS-TYPE SEMICONDUCTOR DEVICE AND METHOD OF FABRICATING THE SAME

(75) Inventors: Hongyong Zhang, Kawasaki (JP); Makoto Igarashi, Kawasaki (JP); Kenichi Yanai, Yonago (JP); Tetsuro Hori, Yonago (JP); Yutaka Takizawa, Yonago (JP)

(73) Assignee: Fujitsu Display Technologies Corporation, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,880

(22) Filed: Mar. 29, 1999

(65) Prior Publication Data

US 2002/0098635 A1 Jul. 25, 2002

(30) Foreign Application Priority Data

Dec. 28, 1998 (JP) .............................. 10-371901

(51) Int. Cl.[7] ...................... H01L 21/8238; H01L 21/00; H01L 21/8234; H01L 21/8236
(52) U.S. Cl. ...................... 438/199; 438/149; 438/153; 438/275; 438/276; 438/154
(58) Field of Search ................. 438/153, 199, 438/149, 275, 276, 154

(56) References Cited

U.S. PATENT DOCUMENTS 5,403,764 A * 4/1995 Yamamoto et al. ......... 438/257
5,563,427 A * 10/1996 Yudasaka et al. ............. 257/72
5,643,826 A * 7/1997 Ohtani et al. .................. 437/88
5,751,037 A * 5/1998 Aozasa et al. .............. 257/315
5,824,573 A * 10/1998 Zhang et al. ................ 438/150
5,885,861 A * 3/1999 Gardner et al. ............. 438/231
6,001,677 A * 12/1999 Shimizu ..................... 438/231
6,033,944 A * 3/2000 Shida ......................... 438/199
6,127,210 A * 10/2000 Mimura et al. ............. 438/153
6,168,980 B1 * 1/2001 Yamazaki et al. .......... 438/162
6,380,016 B2 * 4/2002 Kohler ....................... 438/200

FOREIGN PATENT DOCUMENTS

JP          223651      1/1990
JP        10079517      3/1998

* cited by examiner

Primary Examiner—Caridad Everhart
Assistant Examiner—Chuong A Luu
(74) Attorney, Agent, or Firm—Greer, Burns & Crain, Ltd.

(57) ABSTRACT

In the fabrication of a CMOS-TFT, non-selectively doping (for both of p- and n-type TFTS) and selectively doping (only for the n-type TFT) with p-type impurities (B: boron) are successively performed at very low concentrations to control the threshold voltages (Vthp and Vthn). More specifically, the Id-Vg characteristics of the p- and n-type TFTs are initially negatively shifted. In this state, non-selectively doping is performed positively to shift the p- and n-type TFTs first to adjust the Vthp to a specified value. Selectively doping is then performed positively to shift only the n-type TFT to adjust the Vthn to a specified value. The threshold voltages of the p- and n-type TFTs constructing the CMOS-TFT can be independently and efficiently (with minimum photolithography) controlled with high accuracy.

20 Claims, 26 Drawing Sheets

LASER CRYSTALLIZATION

B DOPING

CMOS-TYPE SEMICONDUCTOR DEVICE AND METHOD OF FABRICATING THE SAME

BACKGROUND OF THE INVENTION

1. Field of the Invention

The present invention relates to a CMOS (Complementary Metal Oxide Semiconductor) device in which p- and n-type thin film transistors are formed, a method of fabricating the CMOS device, an image display apparatus including the CMOS device, and a method of manufacturing the image display apparatus.

2. Description of the Related Art

Recently, with the progress of crystallization technologies using excimer lasers and the like, a liquid crystal display integrated with a peripheral driving circuit that includes thin film transistors (TFTs) using a polysilicon film by a low-temperature process (hereinafter called low-temperature polysilicon film) is emerging to the forefront of the technology. Such a peripheral driving circuit includes a CMOS transistor device as a main component comprising p- and n-type thin film transistors (hereinafter called p-type TFT and n-type TFT, respectively) for achieving a high performance and a low power consumption. Hereinafter, such a CMOS transistor device will be called CMOS-TFT.

Like a CMOS-type single-crystal large scale integrated circuit (hereinafter called single-crystal LSI), setting the threshold voltage (Vth) is one most important subject of a CMOS-TFT. A non-doped polycrystalline silicon is usually used as an active semiconductor layer of such a CMOS-TFT. The threshold voltage, therefore, can be easily set in theory by adjusting the charge amount in a gate insulating film and the interface charge density between the active semiconductor layer and the gate insulating film. In practice, however, the CMOS-TFT having a non-doped active semiconductor layer is extremely difficult to set the threshold voltage by adjustment of the interface charge density, for the reasons explained below.

(1) A gate insulating film of a thin film transistor is a deposited film formed by, e.g., plasma CVD (Chemical Vapor Deposition) and hence does not have such a good bulk characteristic as that of a thermal oxide film. As a result, fixed charges are necessarily produced in the gate insulating film. For example, in a silicon oxide film ($SiO_2$ film) formed by $SiH_4$—$N_2O$ plasma CVD, $SiH_4$ and $N_2O$ molecules which have not been sufficiently decomposed, form positive fixed charges, and consequently, the flat band voltage shifts in the negative direction. This flat band voltage is an important reference value for evaluating the interface between an active semiconductor layer and a gate insulating film and for evaluating the gate insulating film. The larger the shift from a theoretical value is, the worse the evaluation result is.

(2) An insulating film formed by, e.g., plasma CVD or low-pressure CVD does not have such a superior $Si/SiO_2$ interface characteristic as that of a thermal oxide film. So, charges pertaining to the interface level cause a shift of the flat band voltage. In particular, in a thin film transistor using a glass substrate, a clean interface is difficult to obtain because a strongly acidic or strongly alkaline substrate cleaner cannot be used.

(3) Like the interface level, the grain boundary level in a polysilicon film can shift the flat band voltage by capturing or releasing carriers. In particular, impurities such as carbon (C), nitrogen (N), and oxygen (O) contained in the polysilicon film (especially in a grain boundary) may have some influence on the flat band voltage.

For any of the above reasons, the threshold voltages (i.e., the Id-Vg characteristics) of both p- and n-type TFTs of a CMOS-TFT using a non-doped polysilicon film often shift about 1 to 2 V in the negative direction. Although these threshold voltages can be shifted to a certain degree in the positive direction by optimizing the film formation conditions of a gate insulating film, they cannot be controlled to arbitrary values desired. In addition, the range of adjustment is narrow. For solving these problems, a method of controlling the threshold voltages by doping each channel region of a CMOS-TFT with impurities has been proposed.

More specifically, when an amorphous silicon film as an initial state of an active semiconductor layer is formed by plasma CVD, a few ppm to ten-odd ppm (gas ratio) of $B_2H_6$ gas containing p-type impurities is added together with reaction gas ($SiH_4$) and diluent gas ($H_2$). The added $B_2H_6$ gas is decomposed by plasma discharge and incorporated into the amorphous silicon film. The advantage of this method is that the entire amorphous silicon film (both p- and n-type TFTs) can be doped with the impurities without adding any process.

This method is extensively used as a preferable threshold voltage adjustment method in the fabrication of single-crystal LSIs. But, because a mass separation type ion implanter capable of processing large-area substrates such as substrates of liquid crystal displays is still in course of development, an ion-doping apparatus using a non-mass separation type ion source (e.g., an RF plasma ion source) is generally used. That is, an RF plasma ion source is used to add impurities (dopant) at a predetermined concentration to the channel region of a p- or n-type TFT so that the threshold voltage (flat band voltage) is adjusted with the dose of the impurities.

As will be described below, however, the accuracy required in the threshold voltage control of a CMOS-TFT is far severer than that required in a single-crystal LSI, and so no satisfactory control can be obtained by conventional control methods.

Prior to explaining the reasons why the threshold voltage control of the CMOS-TFT requires such high accuracy, the characteristic features of the CMOS-TFT and a peripheral circuit configuration using the CMOS-TFT will be described below.

First, the size of the peripheral circuit using the CMOS-TFT is large.

The mobility of a CMOS-TFT (particularly a CMOS-TFT having a low-temperature polysilicon film) is 30 to 150 ($cm^2$/Vs). This value is low as about $1/20$ to $1/5$ the mobility of a MOS transistor in a single-crystal LSI. To obtain an equivalent driving force, therefore, it is necessary to increase the device size (channel width) at substantially the same ratio. Besides, in a liquid crystal display including CMOS-TFTs, both of signal lines and scan lines are long, so the wiring resistance and stray capacitance are high. Hence, the load on the peripheral circuit is far larger than that of a single-crystal LSI.

As one practical example of the peripheral circuit of a liquid crystal display, a gate driving circuit of a liquid crystal display will be described below. This gate driving circuit includes a plurality of inverter stages in order to increase the driving power of the CMOS-TFT step by step. The channel width increase ratio of a stage to the next stage is about 1:3, and the channel width of the final output stage is about 1.5 mm. Accordingly, the total of the channel widths of all CMOS-TFTs per bit reaches a few mm.

Second, the power-supply voltage of the peripheral circuit of a liquid crystal display is far higher than that of a single-crystal LSI.

While a representative power-supply voltage of the single-crystal LSI is 3.3 (V), the driving voltage of a gate driving circuit corresponding to a 5 V-driven liquid crystal is approximately 16 (V). Besides, both of the S value and the absolute value of the threshold voltage of a CMOS-TFT are large. This is another cause of the high power-supply voltage.

On the basis of the aforementioned intrinsic characteristic features of a CMOS-TFT, the reasons why the threshold voltage control of the CMOS-TFT requires high accuracy will be described below.

Either of an input signal and an output signal changes with the width of a power-supply voltage (Vdd) between its low level "L" (ground potential GND) and high level "H" (power-supply voltage Vdd) (see, e.g., FIG. 16). When the input signal level is "L", a p-type TFT is switched on into its conductive state and an n-type TFT is switched off, so the output signal level goes "H". Conversely, when the input signal level is "H", the n-type TFT is switched on and the p-type TFT is switched off, so the output signal level goes "L". If the threshold voltage (i.e., the Id-Vg curve) of the n-type TFT shifts to the negative side, this n-type TFT is not completely switched off when the input signal level is "L". Consequently, a leakage current called tunneling current flows in the order of a node at Vdd (power-supply potential), the p-type TFT, the n-type TFT and a node at GND (ground potential).

This tunneling current is equal to a drain current IO (hereinafter called zero current) when Vg=0 (V) on the Id-Vg curve of the n-type TFT. As the threshold voltage shifts to the negative side, the zero current increases. Similarly, if the threshold voltage of the p-type TFT shifts to the positive side, a tunneling current flows due to the zero current of the p-type TFT when the input signal level is "H".

As described above, the tunneling current greatly increases the power consumption of the CMOS-TFT. In the aforementioned gate driving circuit, the static power consumption by the tunneling current can reach several tens of mW or more for 1 (nA/μm) per unit channel width.

Due to the above-described first and second characteristic features of the CMOS-TFT, the power consumption of the whole peripheral circuit significantly increases if the threshold voltage shifts even slightly. Besides, a large tunneling current causes serious defects or obstacles such as a decrease in the signal amplitude, local heat generation, and progressive deterioration of the TFT characteristics.

As described above, unlike in a single-crystal LSI, in a CMOS-TFT, the tunneling current produces a fatal damage and it is necessary to set the threshold voltage with high accuracy to prevent the tunneling current. By the aforementioned conventional threshold voltage control method using ion-doping, however, no such high accuracy can be obtained and so satisfactory results are difficult to obtain. More specifically, this is due to the following features of the conventional threshold voltage control method.

(1) Ion implantation of p-type impurities changes the whole of an active semiconductor layer into a weak p-type semiconductor. The threshold voltages of both n- and p-type TFTs shift to the positive side accordingly. In principle, it is impossible separately to set them. It is therefore obvious that the threshold voltage of the CMOS-TFT is difficult to optimize by the conventional method. Besides, it is impossible greatly to reduce the tunneling current in the CMOS-TFT by the conventional method, in principle.

(2) In the conventional method, if an amorphous silicon film is excessively doped with p-type impurities before crystallization, the crystal grain size may decrease in case of laser crystallization, or, in case of thermal crystallization (SPC) nucleation and crystal growth may become difficult to develop and so crystallinity may degrade.

(3) When an RF plasma ion source is used, doping at a low dose (approximately $5 \times 10^{12}$ (/cm$^2$) or less) with a small ion current required is extremely difficult because the ion current density is high. Besides, the use of the RF ion source increases the number of parameters (e.g., RF power, pressure, and conditions of electrodes and chamber inner walls) on ion current. This method is therefore inferior in stability and reproducibility of ion species or ion current.

(4) The activation ratio of impurities is low in a low-temperature fabrication process using a glass substrate. In particular, when the dose to the channel region is relatively high, ion damages are difficult to repair, and activation becomes insufficient. A channel-doping step using a lower dose is desired therefore. But, an ion-doping apparatus using a conventional RF plasma ion source cannot well perform doping at a low dose. Besides, to optimize the threshold voltage of a CMOS-TFT by selectively doping, photolithography must usually be performed twice or more. This complicates the fabrication process.

SUMMARY OF THE INVENTION

It is an object of the present invention to provide a semiconductor device fabrication method capable of easily and reliably setting the threshold voltage of a CMOS-TFT with high accuracy, and a semiconductor device including a CMOS-TFT whose threshold voltage is accurately set.

A semiconductor device fabrication method of the present invention is a method of fabricating a CMOS device in which p- and n-type thin film transistors are formed, comprising the steps of non-selectively doping the whole of a thin film with p-type impurities, said thin film to be an active semiconductor layer including prospective regions to form said p- and n-type thin film transistors selectively doping only the prospective region to form said n-type thin film transistor with p-type impurities at a higher concentration than that in said step of non-selectively doping, and annealing said thin film to activate the p-type impurities contained therein, wherein threshold voltages of said p- and n-type thin film transistors are independently set by said step of non-selectively doping and said step of selectively doping.

Another aspect of the semiconductor device fabrication method of the present invention is a method of fabricating a semiconductor device comprising a plurality of CMOS transistors in each of which p- and n-type thin film transistors are formed and which are classified into at least two element groups having different operating voltages, said method comprising the steps of non-selectively doping a thin film with p-type impurities, said thin film to be an active semiconductor layer including prospective regions to form said p- and n-type thin film transistors selectively doping only the prospective regions of said thin film to form said n-type thin film transistors with p-type impurities at a higher concentration than that in said step of non-selectively doping, and annealing said thin film to activate the p-type impurities contained therein, wherein said step of non-selectively doping and said step of selectively doping are sequentially performed a predetermined number of times necessary for each element group to all of the element groups, thereby setting threshold voltages corresponding to the operating voltages of the element groups and independently setting threshold voltages of said p- and n-type thin film transistors forming each element group.

An image display apparatus manufacturing method of the present invention is a method of manufacturing an image display apparatus comprising an image display unit in which a plurality of pixels are arranged in a matrix, a first control circuit for controlling the drive of rows of said image display unit, a second control circuit for controlling the drive of columns of said image display unit, and CMOS transistors in each of which p- and n-type thin film transistors are formed, said CMOS transistors being formed in at least one of said image display unit and said first and second control circuits and having different operating voltages, said method comprising the steps of non-selectively doping a thin film with p-type impurities, said thin film to be an active semiconductor layer including prospective regions to form said p- and n-type thin film transistors, selectively doping only the prospective regions of said thin film to form said n-type thin film transistors with p-type impurities at a higher concentration than that in said step of non-selectively doping, and annealing said thin film to activate the p-type impurities contained therein, wherein said step of non-selectively doping and said step of selectively doping are sequentially performed a predetermined number of times necessary for each CMOS transistor, thereby independently setting threshold voltages of said p- and n-type thin film transistors in accordance with the corresponding operating voltages.

A semiconductor device of the present invention is a CMOS device in which p- and n-type thin film transistors are formed, wherein said p-type thin film transistor has a first active semiconductor layer formed by doping its channel region with p-type impurities at a concentration of not more than $1 \times 10^{18}/cm^3$ such that the concentration distribution in a direction of the thickness of said first active semiconductor layer is substantially uniform, and said n-type thin film transistor has a second active semiconductor layer formed by doping its channel region with p-type impurities at a higher concentration than that in said first active semiconductor layer such that the concentration distribution in a direction of the thickness of said second active semiconductor layer has a peak near a surface.

An image display apparatus of the present invention comprises an image display unit in which a plurality of pixels are arranged in a matrix, a first control circuit for controlling the drive of rows of said image display unit, and a second control circuit for controlling the drive of columns of said image display unit, at least one of said image display unit and said first and second control circuits comprising CMOS transistors in each of which p- and n-type thin film transistors are formed and which have different operating voltages, said p-type thin film transistor has a first active semiconductor layer formed by doping its channel region with p-type impurities such that the concentration distribution in a direction of the thickness of said first active semiconductor layer is substantially uniform, and said n-type thin film transistor has a second active semiconductor layer formed by doping its channel region with p-type impurities at a higher concentration than that in said first active semiconductor layer such that the concentration distribution in a direction of the thickness of said second active semiconductor layer has a peak near a surface.

The present inventors have found for the first time in this field of art that in a CMOS-TFT, the dependence of the threshold voltage of a p-type TFT on the doping amount of p-type impurities is larger than that of an n-type TFT (FIG. 2A). That is, even when the channel regions of p- and n-type TFTs are doped with p-type impurities at the same concentrations, the change amounts of the threshold voltages are different from each other. In other words, the optimum amount of p-type impurities added for controlling the threshold voltages is different between both type of TFTs. The optimum threshold voltage of the p-type TFT can be obtained at a lower doping concentration than that of the n-type TFT.

Besides, the dependence on the doping amount of p-type impurities has two different regions: a region a indicating a low doping concentration, and a region b indicating a relatively high doping concentration (FIGS. 2A and 2B). In the region a, the threshold voltage (Vthn) of an n-type TFT hardly changes, whereas the threshold voltage (Vthp) of a p-type TFT greatly changes. In the region b, the threshold voltages of both of the n- and p-type TFTs change in substantially the same manner.

Since p- and n-type TFTs have the aforementioned properties, a method of easily adjusting the threshold voltage of either TFT to the optimum value is suggested as follows.

A non-doped polysilicon film internally has an "n-type-like" impurity level, interface level, and grain boundary level, so the film is weakly n-type. The effect of the n-type-like level can be cancelled by externally doping with p-type impurities. As described above, the dependence on p-type impurities in the region a is different from that in the region b, and the region b normally shows predictable dependence. The p-type impurity concentration in the boundary between these two regions is therefore considered a concentration necessary to cancel the n-type-like level. If the n-type-like level is cancelled, the dependence of the threshold voltage on p-type impurities which is supposed originally to exist in the region b appears. A p-type TFT is more sensitive to doping with p-type impurities and has a lower optimum doping concentration for threshold voltage control than an n-type TFT. As a result, when the channel regions of both types of TFTs are doped with p-type impurities at the same time, the threshold voltage of the p-type TFT is first adjusted to a desired value (specified value).

A semiconductor device fabrication method of the present invention efficiently and accurately adjusts the threshold voltage by using the aforementioned characteristics of the threshold voltage. First, non-selectively doping with p-type impurities at a very low concentration is performed for the channel regions of both types of TFTs at the same time. Consequently, the n-type-like level of an active semiconductor layer is adjusted to an intrinsic state or a weak p-type state, and the threshold voltage (Vthp) of the p-type TFT is adjusted to the specified value. Since the threshold voltage (Vthn) of the n-type TFT has not reached the specified value yet at this time, selectively doping with p-type impurities is then performed only for the channel region of the n-type TFT. Consequently, the Vthn is also adjusted to the specified value. In the present invention, therefore, the threshold voltages of p- and n-type TFTs can be independently adjusted to specified values with minimum necessary labor because no photolithography is necessary in the process of non-selectively doping with p-type impurities.

Since the p-type impurity concentration required for the optimum Vthp of a p-type TFT is relatively low, it is possible to avoid adverse effects of excessively doping with impurity on the crystallization step. Besides, the subsequent activation step can be performed before island formation. Impurities of p-type, therefore, can be activated at a high temperature without being influenced by substrate shrinkage.

The profile distribution by non-selectively doping is flat or broad, so an active semiconductor layer becomes an intrinsic or weak p-type semiconductor entirely from its upper to lower portions. Consequently, it is possible to suppress the generation of a back channel (caused by fixed electric charges in a gate insulating film) near the interface between the gate insulating film and the surface of the active semiconductor layer on the side away from the gate insulating film.

Besides, the channel region of an n-type TFT has already become an intrinsic or weak p-type semiconductor by non-selectively doping. Accordingly, the dose in the subsequent selectively doping process can be greatly reduced, and the activation ratio increases because ion damages are little.

Furthermore, doping with p-type impurities for threshold voltage control can be performed by using a non-mass separation type ion-doping apparatus using a DC ion source capable of low-dose doping in a wide area. In that case, the Vthn of an n-type TFT can be independently and accurately adjusted.

In the present invention, the above threshold voltage control method is applied to the fabrication of a semiconductor device (e.g., a liquid crystal display) requiring a plurality of CMOS-TFTs classified into at least two element groups having different operating voltages. In this semiconductor device, not only p- and n-type TFTs constructing each CMOS-TFT have different threshold voltages but also the absolute values of the threshold voltages change from one element group to another different in operating voltage. In the present invention, therefore, non-selectively doping with p-type impurities is first performed for all of these element groups, and then non-selectively doping and/or selectively doping with p-type impurities is performed a predetermined number of times in accordance with each element group.

More specifically, to form element groups A, B, and C (operating voltages: A<B<C), for example, non-selectively doping is first performed for all prospective regions of these element groups A, B, and C. Subsequently, in accordance with the operating voltages of these element groups, non-selectively doping is performed for, e.g., B and C. After then, selectively doping is performed for B and C, and selectively doping is finally performed only for C. In this manner, the threshold voltages of p- and n-type TFTs of CMOS-TFTs forming these element groups are adjusted. Note that the modes of non-selectively doping and/or selectively doping change in accordance with the operating voltages of element groups, so various combinations are possible. Note also that an element group can contain an element constructed only of an n-type TFT.

As described above, for all element groups, non-selectively doping and selectively doping are performed predetermined numbers of times corresponding to each element group. This eliminates complicated steps such as photolithography in case that threshold voltage control is separately performed for element groups. Additionally, the threshold voltages of p- and n-type TFTs of CMOS-TFTs constructing each element group are adjusted. That is, the threshold voltages of p- and n-type TFTs of a CMOS-TFT in each element group can be independently adjusted to the specified values with a minimum necessary number of times of doping (and with minimum necessary labor).

Also in the aforementioned method, doping with p-type impurities for threshold voltage control can be performed by using a non-mass separation type ion-doping apparatus using a DC ion source capable of low-dose doping. In that case, threshold voltage control can be more accurately and reliably performed.

The present invention realizes a semiconductor device fabrication method capable of easily and reliably setting the threshold voltage of a CMOS-TFT with high accuracy and a semiconductor device having a CMOS-TFT whose threshold voltage is accurately set.

Besides, the present invention can easily and reliably set different threshold voltages with high accuracy in an image display apparatus including different kinds of CMOS-TFTs having different electric characteristics and different operating voltages.

DETAILED DESCRIPTION OF THE PREFERRED EMBODIMENTS

Hereinafter, several embodiments of the present invention will be described in detail with reference to the accompanying drawings.

First Embodiment

Figure 1:
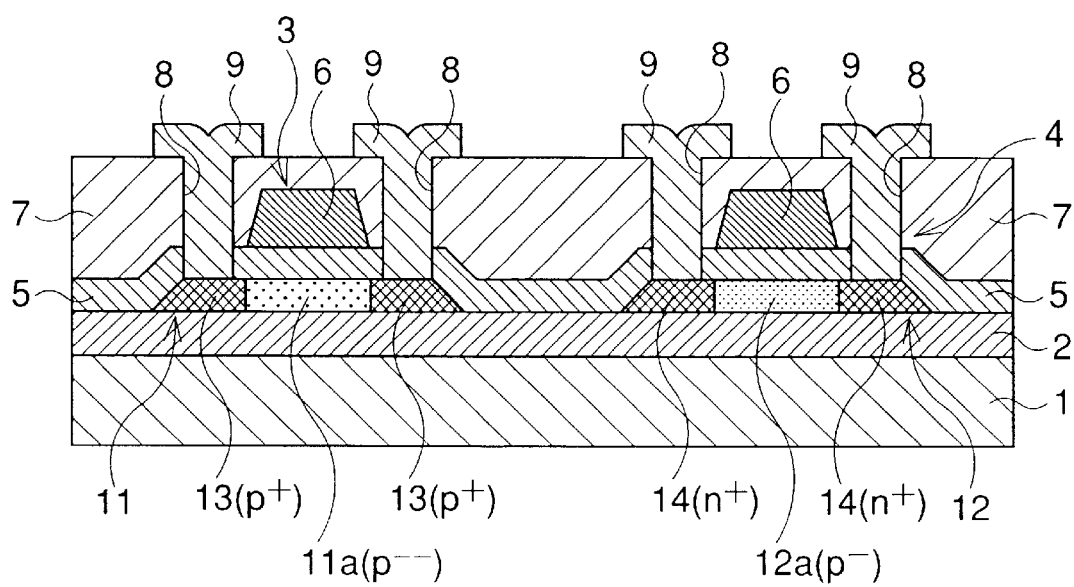
FIG. 1 is a schematic sectional view showing the principal part of a CMOS-TFT according to the first embodiment.

The first embodiment will be described below with reference to FIGS. 1 to 4. In this embodiment, a so-called top gate type CMOS-TFT including p- and n-type TFTs will be explained. FIG. 1 is a schematic sectional view showing the principal part of the CMOS-TFT according to the first embodiment. This CMOS-TFT shown in FIG. 1 is merely an example of the present invention, so the present invention is applicable to CMOS-TFTs with other configurations. Those configurations will be described later in the second embodiment together with their fabrication methods.

In this CMOS-TFT, a pair of TFTs (a p-type TFT 3 and an n-type TFT 4) is formed on an insulating underlayer 2 such as a silicon oxide film provided on a substrate 1 made of, e.g., glass.

The p- and n-type TFTs 3 and 4 have island-like active semiconductor layers 11 and 12 made of polysilicon, respectively. Above these active semiconductor layers 11 and 12, band-like gate electrodes 6 made of polysilicon or the like are formed by patterning on a gate insulating film 5 such as a silicon oxide film. In the active semiconductor layer 11 of the p-type TFT 3, a pair of a source and a drain 13 ($p^+$) is formed by implanting p-type impurities at a relatively high concentration into portions on both sides of the gate electrode 6. In the active semiconductor layer 12 of the n-type TFT 4, a pair of a source and a drain 14 ($n^+$) is formed by implanting n-type impurities into portions on both sides of the gate electrode 6.

An insulating interlayer 7 such as a silicon nitride film is so formed as to cover the p- and n-type TFTs 3 and 4. Contact holes 8 are formed partially to expose the surfaces of the source/drain pairs 13 and 14. Metal interconnecting films 9 are formed to plug the contact holes 8 and connected to the source/drain pairs 13 and 14. The metal interconnecting films 9 extend on the insulating interlayer 7. In this manner, the CMOS-TFT is constructed.

Impurities of p-type are added at different low concentrations to portions immediately below the gate electrodes 6, i.e., channel regions 11a and 12a of the active semiconductor layers 11 and 12 in order to control the threshold voltages (Vthp of the region 11a and Vthn of the region 12a). Practical effects of this threshold voltage control and concentration distributions in these channel regions will be described below. Here, non-selectively doping with p-type impurities means that the impurities are added to both of the p- and n-type TFT regions of the CMOS-TFT, and selectively doping with p-type impurities means that the impurities are added to one of the p- and n-type TFT regions of the CMOS-TFT.

Figure 2A:
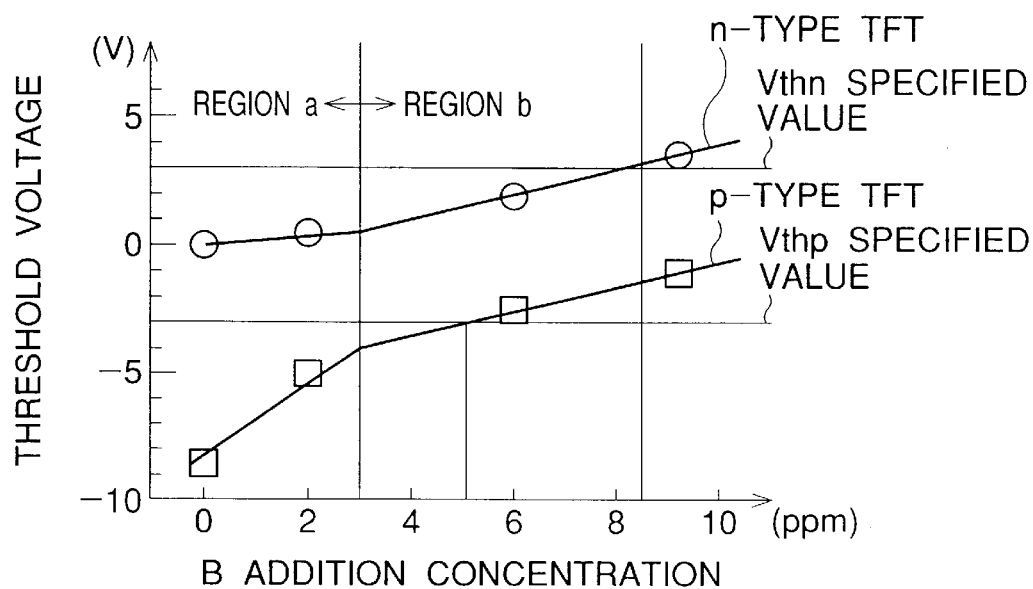
FIGS. 2A and 2B are graphs showing the dependence of the threshold voltage and the zero current on the doping concentration of p-type impurities (B) when an amorphous silicon film is formed.
Figure 2B:
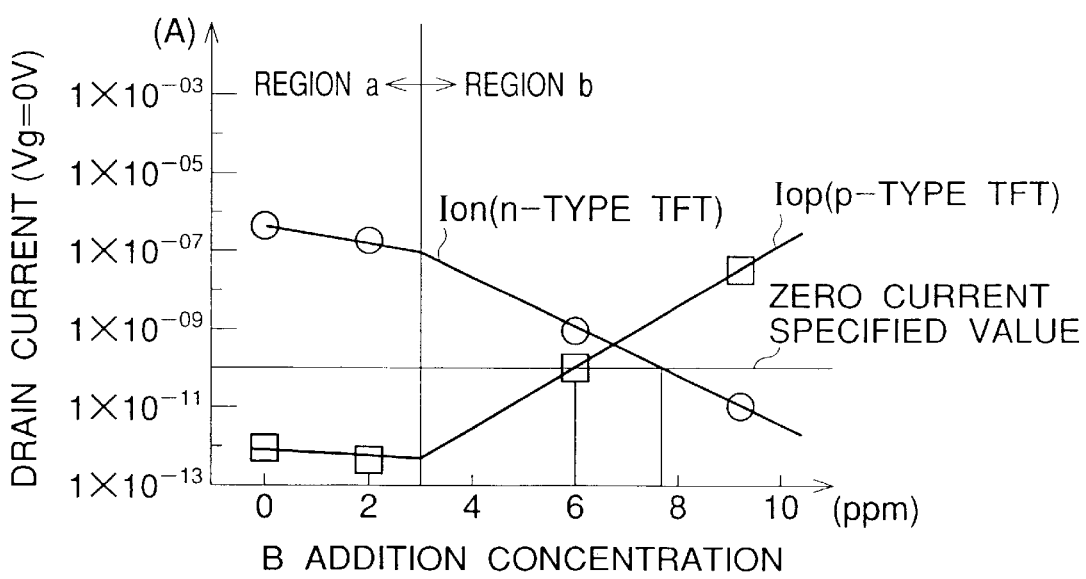

FIGS. 2A and 2B are graphs showing the dependence of the threshold voltage and a zero current on the concentration of added p-type impurities at the time of forming an amorphous silicon film.

As shown in FIGS. 2A and 2B, the dependence of the threshold voltage and the zero current on the dose of p-type impurities (boron (B) in this embodiment, and the following numerical values were calculated on the basis of a gas flow ratio of $B_2H_6/SiH_4$ at the time of forming the film formation by plasma CVD) has two different regions, that is, a region a at a lower doping concentration, and a region b at a relatively high doping concentration. The B-doping concentration in the boundary between both regions is about 3 ppm.

In the region a, the Vthn of the n-type TFT hardly changes but the Vthp of the p-type TFT greatly changes. In the region b, the threshold voltages of both of the p- and n-type TFTs linearly change at nearly equal rates in accordance with the B-doping concentration. The dependence of the Vth of the p-type TFT on the B dose is stronger than that of the n-type TFT. That is, even when p-type impurities are added at the same concentration to the p- and n-channel regions in the region a, the change amount of the threshold voltage is different between p- and n-channel regions. In other words, the optimum concentration of added p-type impurities for setting a desired threshold voltage is different between the n- and p-type TFTs. For example, a B-doping concentration meeting the specified value (Vth=−3 V) of the p-type TFT is 6 ppm, and a B-doping concentration meeting the specified value (Vth=+3 V) of the n-type TFT is 8.5 ppm. That is, the specified value of the Vth of the p-type TFT can be obtained at a lower doping concentration than that of the n-type TFT.

An important conclusion about threshold voltage control is drawn from the above fact. That is, the threshold voltages of the p- and n-type TFTs cannot be simultaneously adjusted to their optimum values only by non-selectively doping the p- and n-type TFTs with p-type impurities, i.e., by simultaneously doping them with the same amount of p-type impurities.

As shown in FIG. 2B, the tendency of the zero current (Id when Vg=0 V) of the n-type TFT is inverse to that of the p-type TFT. When the B-doping concentration increases, the zero current (Ip0) of the p-type TFT increases and the zero current (In0) of the n-type TFT decreases. For example, the B-doping concentrations meeting the specified value ($1 \times 10^{-10}$ A) of the zero current are 6 and 8 ppm for the p- and n-type TFTs, respectively.

An important conclusion about zero current control is drawn from the above fact. That is, the zero currents of the p- and n-type TFTs cannot be simultaneously adjusted to their optimum values only by non-selectively doping with p-type impurities.

In this embodiment, selectively doping as described below is performed in addition to non-selectively doping with p-type impurities, and thereby the threshold voltages and zero currents of the p- and n-type TFTs are optimized, which cannot be performed by once doping with p-type impurities.

FIGS. 3A to 3D show the p-type impurity distribution profiles in the direction of depth in a channel region of the CMOS-TFT of this embodiment.

Figure 3A:
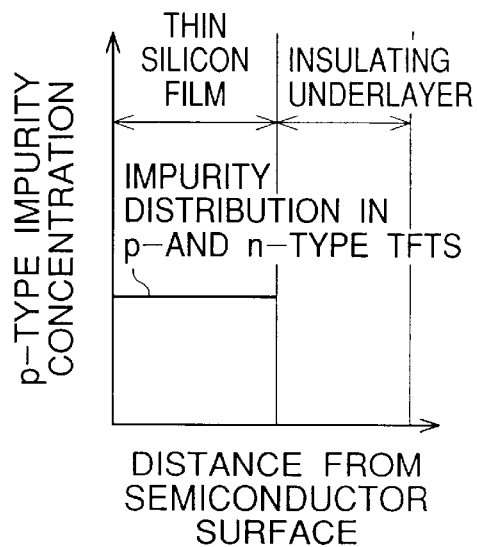
FIGS. 3A to 3D are graphs showing the concentration distributions of p-type impurities (B) in the channel depth direction of a CMOS-TFT.
Figure 3B:
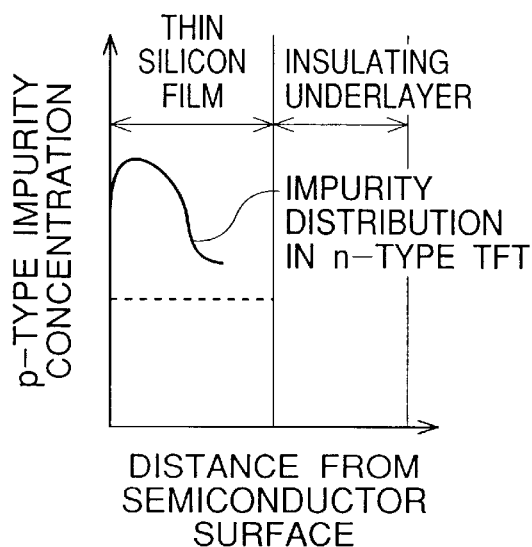

First, a case of non-selectively doping with gas will be described. The first doping step with p-type impurities (B), i.e., non-selectively doping is performed with gas at the time of forming an amorphous silicon film. As shown in FIG. 3A, the resultant concentration distribution is almost flat (even) in the channel depth direction. Subsequently, the second doping step with p-type impurities (B), i.e., selectively doping is performed only in the activation region of the n-type TFT in the crystallized polysilicon film by using a non-mass separation type ion-doping apparatus with a DC filament ion source (hereinafter, simply called a DC ion-doping apparatus). As shown in FIG. 3B, the resultant concentration distribution has a peak near the surface of the activation region of the n-type TFT.

Figure 3C:
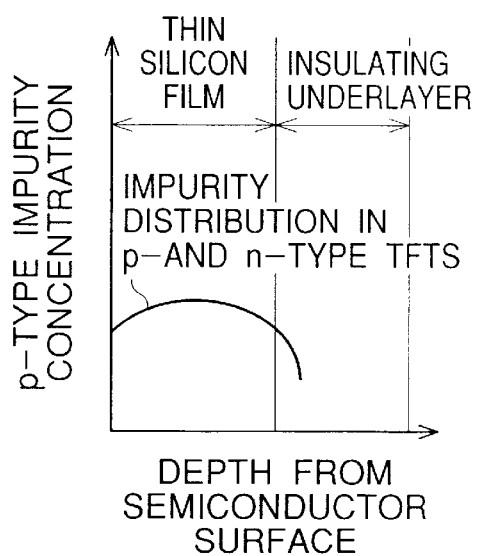
Figure 3D:
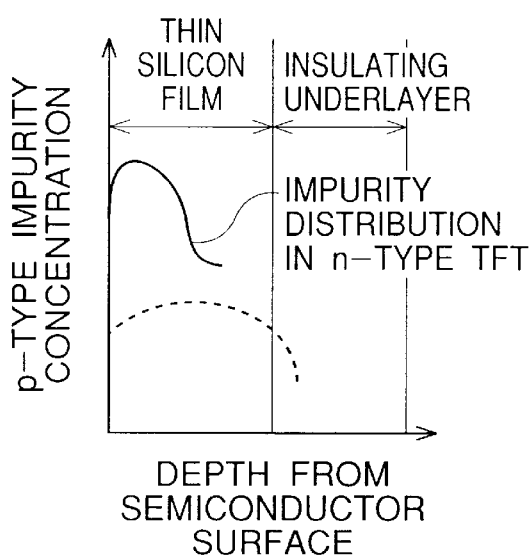

Next, a case of non-selectively doping with the DC ion doping apparatus will be described. The first doping step with p-type impurities, i.e., non-selectively doping is performed by using the DC ion doping apparatus. As shown in FIG. 3C, the resultant concentration distribution is nearly broad (approximately flat) in the channel depth direction. Subsequently, the second doping step with p-type impurities, i.e., selectively doping is performed only in the activation region of the n-type TFT in the crystallized polysilicon film by using the DC ion-doping apparatus. As shown in FIG. 3D, the resultant concentration distribution has a peak near the surface of the activation region of the n-type TFT.

Although the impurity concentration near the upper or lower interface of the active semiconductor layer sometimes slightly increases or decreases by impurity-doping or crystallization, such a flat or broad distribution as described above is obtained as a whole by non-selectively doping. When impurity concentration analysis such as SIMS (Secondary Ion Mass Spectrometry) is used, a kind of peak sometimes appears near the interface due to problems of the evaluation method itself even if the impurity concentration near the interface is uniform. It is therefore necessary to reconfirm by some analysis methods.

Next, a method of adjusting the threshold voltages and zero currents of the CMOS-TFT by the above-mentioned twice impurity-doping will be described below with reference to FIGS. 4A to 4C.

Figure 4A:
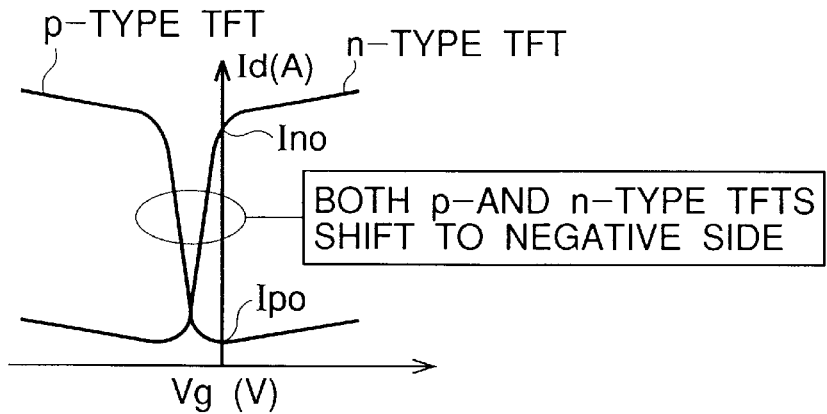
FIGS. 4A to 4C are graphs showing changes in the Id-Ig characteristic when doping with p-type impurities (B) is performed.

FIG. 4A shows the Id-Vg characteristics of a CMOS-TFT having a non-doped active semiconductor layer. As shown in FIG. 4A, the Id-Vg characteristics of both of p- and n-type TFTs shift to the negative side, and the zero current (In0) of the n-type TFT is large. In this state, the tunneling current and power consumption are extremely large, so the CMOS-TFT cannot normally operate.

Figure 4B:
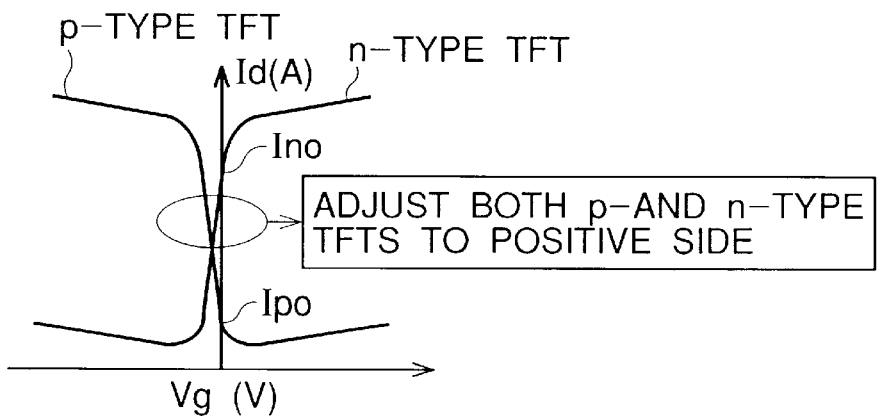

FIG. 4B shows the Id-Vg characteristics when the first doping step with p-type impurities (non-selectively doping) is performed in the channel regions of the p- and n-type TFTs. As shown in FIG. 4B, the Id-Vg characteristics of both of the p- and n-type TFTs shift to the positive side, and the threshold voltage (Vthp) and the zero current (Ip0) of the p-type TFT meet its specified values. The p-type impurity distribution in the direction of depth is flat or broad in both of the p- and n-type TFTs. In this state, however, the threshold voltage (Vthn) of the n-type TFT has not reached the specified value yet, and its zero current (In0) is relatively large. Although the CMOS-TFT can operate substantially normally in this state, the tunneling current and power consumption are large, so there is almost no fabrication margin for ensuring the operating performance.

Figure 4C:
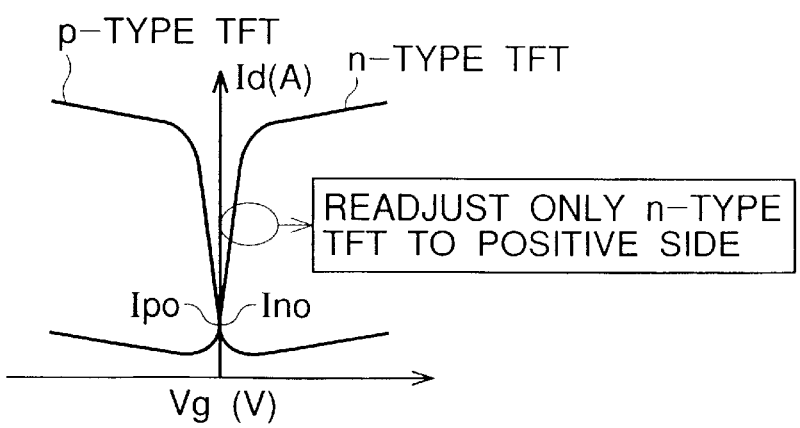

FIG. 4C shows the Id-Vg characteristics when the second doping step with p-type impurities (selectively doping) is performed only in the channel region of the n-type TFT subsequently to the state shown in FIG. 4B. In comparison with FIG. 4B, the Id-Vg characteristic of only the n-type TFT shifts to the positive side, and the threshold voltage (Vthn) and the zero current (In0) of the n-type TFT meet its specified values. In this state, the threshold voltages (Vthp and Vthn) and the zero currents (Ip0 and In0) of both of the p- and n-type TFTs meet their specified values. The p-type impurity distribution in the direction of depth is flat or broad as shown in FIGS. 3A or 3C. The n-type impurity distribution in the direction of depth has a peak near the surface as shown in FIGS. 3B or 3D. In this state, the CMOS-TFT operates very well and normally, the tunneling current and power consumption are very small, and the fabrication margin for ensuring the operating performance is large.

In the above description, doping with p-type impurities is performed in the order of non-selectively doping and selectively doping. But, this order can be reversed as long as no problem arises in the process. Besides, the number of times of non-selectively doping is not particularly limited.

In the first embodiment as described above, the threshold voltages (and zero currents) of p- and n-type TFTs can be separately, easily and reliably adjusted to specified values with the minimum necessary labor by combining two kinds of p-type impurity-doping processes (non-selectively doping and selectively doping).

Second Embodiment

The second embodiment of the present invention will be described below with reference to FIGS. 5 to 7. In this embodiment, a practical fabrication method of a CMOS-TFT will be descried. In the second embodiment, the same reference numerals as those in the CMOS-TFT of the first embodiment denote the same parts as those of the CMOS-TFT of the first embodiment, and detailed descriptions thereof will be omitted. FIGS. 5A to 5F are schematic sectional views showing a CMOS-TFT fabrication method in order of steps.

Figure 5A:
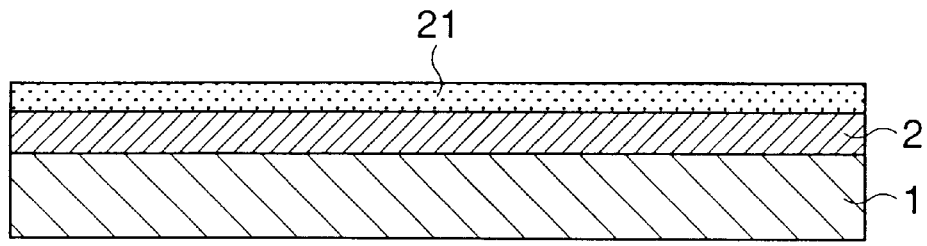
FIGS. 5A to 5F are schematic sectional views showing a CMOS-TFT fabrication method according to the second embodiment in order of steps.

First, as shown in FIG. 5A, an insulating underlayer 2 such as a silicon oxide film of a thickness of about 200 to 300 nm is formed on a substrate 1 of, e.g., glass by plasma CVD or sputtering. An amorphous silicon film 21 of a thickness of about 30 to 100 nm is then formed by plasma CVD. At this time, a very small amount of 5 to 6 ppm (gas ratio) of $B_2H_6$ is added to source gas of $SiH_4$ as the first doping step with p-type impurities (non-selectively doping) for threshold voltage control, and thereby the amorphous silicon film 21 can be used as a starting film of weak p-type ($p^{--}$-type). Since p-type impurities (B) are added simultaneously with the film formation, the B concentration distribution is flat as shown in FIG. 3A. In consideration of effective controls of the threshold voltages and zero currents, it is preferable that the B concentration in the $p^{--}$-type amorphous silicon film 21 is extremely low, around 1 to 10 ppm (or $1\times10^{18}/cm^3$ or less, ideally, $1\times10$ to $1\times10^{17}/cm^3$).

Figure 5B:
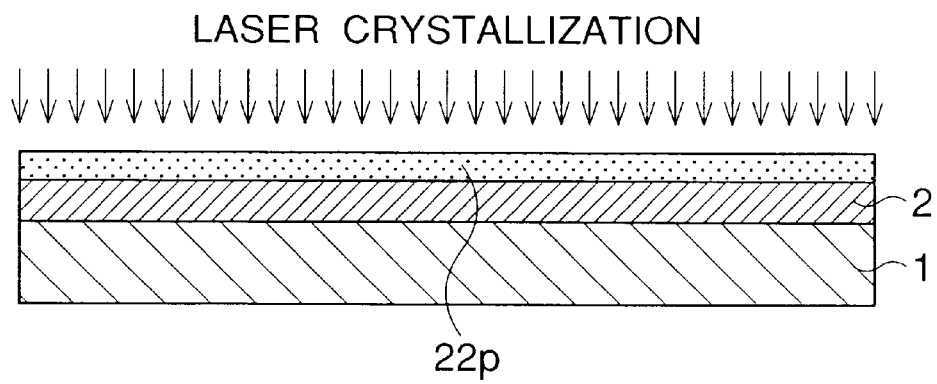

Subsequently, as shown in FIG. 5B, an XeCl excimer laser (wavelength of 308 nm) for emitting a linear laser beam is used to irradiate the $p^{--}$-type amorphous silicon film 21 with 300 to 400 mJ/cm of the laser beam at room temperature in N atmosphere, and thereby, the amorphous silicon film 21 is crystallized to form a $p^{--}$-type polysilicon film 22.

Figure 5C:
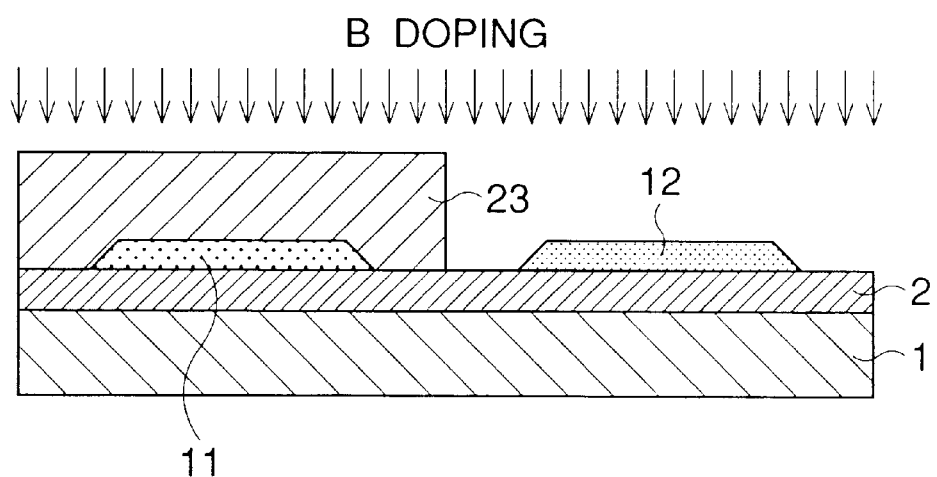

As shown in FIG. 5C, photolithography and dry etching are sequentially performed for the $p^{--}$-type polysilicon film 22 to form separated island-like active semiconductor layers 11 and 12 as components of p- and n-type TFTS, respectively.

Next, a resist mask 23 is formed by photolithography to cover only the active semiconductor layer 11. As the second doping step with p-type impurities for threshold voltage control, 3% $B_2H_6$ is used as source gas, the acceleration voltage is set at 10 to 30 kV, and ion-doping (selectively doping) with B (boron) is performed at a dose of about $5\times10^{14}/cm^3$ such that the concentration is slightly higher (about $1\times10^{17}$ to $1\times10^{18}/cm^3$) than that by non-selectively doping as described above. B is then doped only into the exposed active semiconductor layer 12, and thereby, the conductivity type of the active semiconductor layer 12 changes from p-type to relatively high p-type ($p^-$-type). In this state, the B concentration distribution in the active semiconductor layer 12 has a peak near the surface as shown in FIG. 3B.

Figure 6:
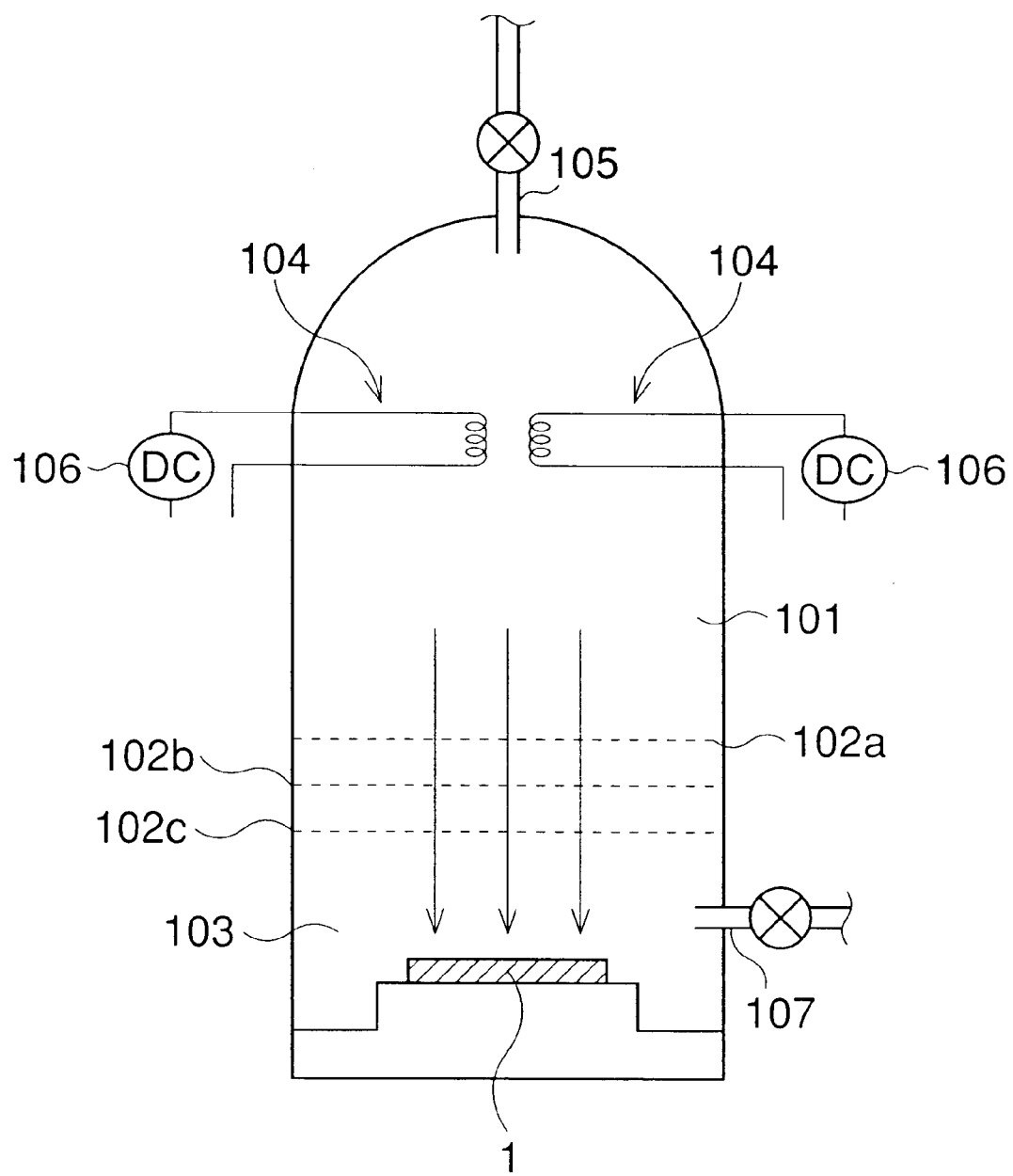
FIG. 6 is a schematic view showing the main parts of a non-mass separation type ion-doping apparatus.
Figure 7A:
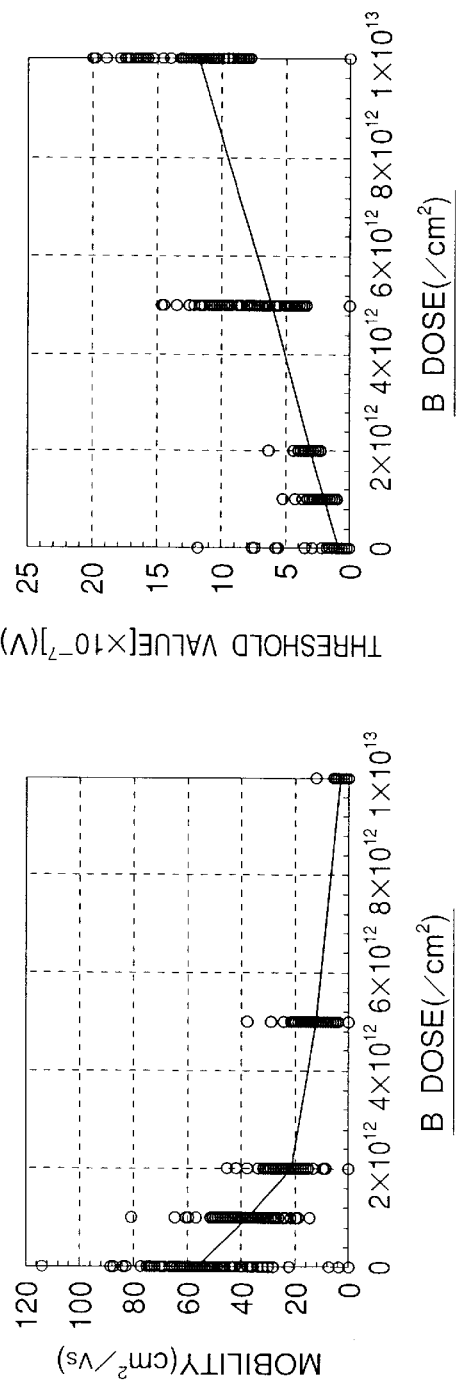
FIGS. 7A to 7D are graphs showing experiments of low-dose doping using a DC ion-doping apparatus.
Figure 7B:
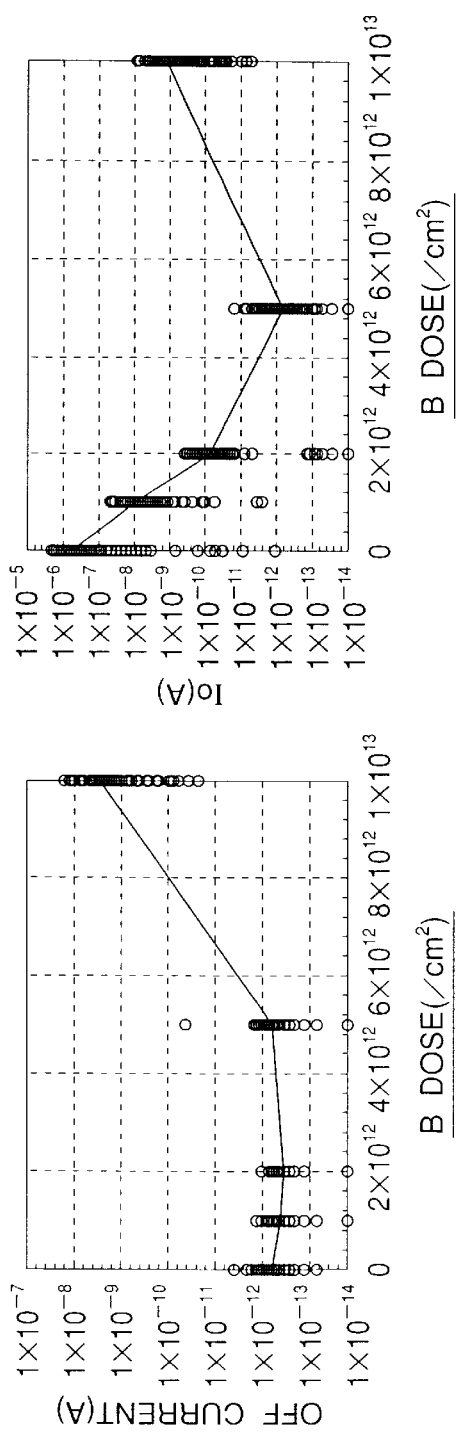
Figure 7C:
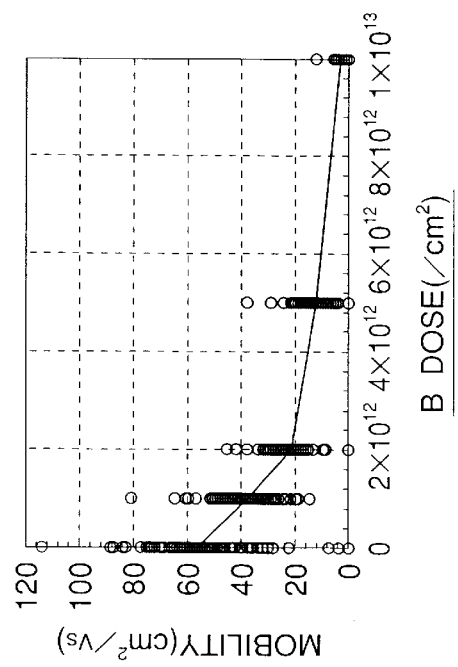
Figure 7D:
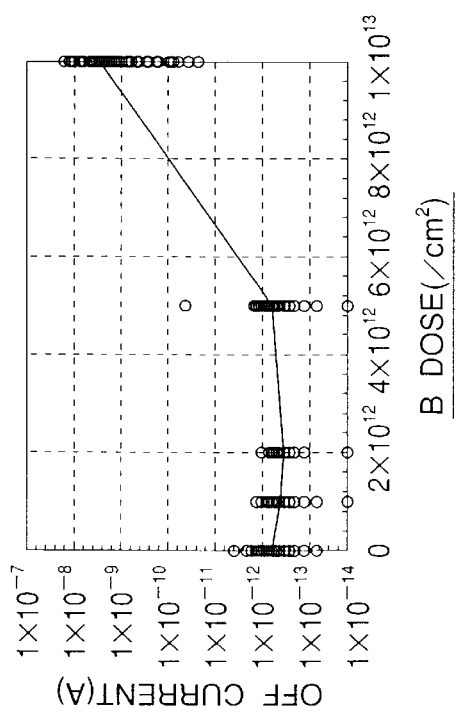

In this embodiment, this step of selectively doping is performed with a non-mass separation type ion-doping apparatus including a DC filament ion source (DC ion-doping apparatus) as shown in FIG. 6. This DC ion-doping apparatus comprises a source gas inlet port 105, a plasma chamber 101 for internally generating plasma, an extracting electrode 102a, an accelerating electrode 102b and a decelerating electrode 102c for extracting ions from the generated plasma accelerating and decelerating them, a chamber 103 in which a substrate is placed, and a source gas exhaust port 107. The plasma chamber 101 is provided with a DC filament ion source 104 for changing source gas into plasma by applying a high voltage from a DC power supply 106. This DC ion-doping apparatus greatly improves the controllability in a range of low dose ($5\times10^{10}$ to $5\times10^{12}/cm^2$) in comparison with a non-mass separation type ion-doping apparatus using a conventional RF ion source.

An experiment of doping at low doses with the DC ion-doping apparatus will be described below. In this experiment, B ions were doped into an amorphous silicon film to which B was added in the form of gas, and the accuracy of threshold voltage control and zero current control at low doses were checked.

The DC ion-doping apparatus was used to perform directly ion-doping with an acceleration voltage of 10 kV and at a predetermined dose from 0 to $1\times10^{13}/cm^2$ for an amorphous silicon film (with no protective film) of a thickness of about 350 Å to which 2 ppm of B as p-type impurities had been added under the conditions of an LC energy of 300 mJ (atmospheric pressure, no pre-processing) and an LA energy of 210 mJ (atmospheric pressure). LDD regions of n-type of the CMOS-TFT were formed with an acceleration voltage of 70 kV and at a dose of $1\times10^{14}/cm^2$. LDD regions of p-type of the CMOS-TFT were formed with an acceleration voltage of 70 kV and at a dose of $1\times10^{15}/cm^2$.

FIGS. 7A to 7D show the experimental results on the mobility ($cm^2/Vs$), threshold voltage ($\times10^{-7}$ V), OFF current (A), and zero current (A), respectively. As shown in FIGS. 7A to 7D, even at a very low dose, the threshold voltage and zero current change and hence it is found that they are controllable. For example, it is found that the threshold voltage changed by about 3 V at a very low dose of about $1\times10^{12}/cm^2$. A decrease in the mobility in accordance with an increase in the dose is probably due to an increase in the LDD resistance because of the fixed LDD-doping conditions.

Figure 5D:
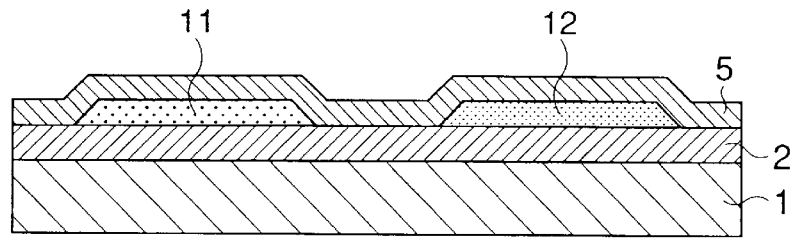

Subsequently, the resist mask 23 is removed by ashing with $O_2$ plasma. After then, as shown in FIG. 5D, a silicon oxide film of a thickness of about 100 to 120 nm is so deposited as to cover the active semiconductor layers 11 and 12 by plasma CVD or low-pressure CVD, and thereby a gate insulating film 5 is formed. The substrate 1 is then annealed to activate B doped in the active semiconductor layers 11 and 12 and improve the film quality of the gate insulating film 5. Since the DC ion-doping apparatus is used in B ion-doping as described above, the active semiconductor layers 11 and 12 are easily activated. This is presumably because hydrogen ions such as $H_3^+$ are few.

Next, a polysilicon film is deposited on the gate insulating film 5 by plasma CVD. Photolithography and dry etching are sequentially performed for the polysilicon film. By this patterning step, gate electrodes 6 of the polysilicon film are formed so as to extend in the form of bands on the active semiconductor layers 11 and 12. These gate electrodes 6 are used as masks to perform ion-doping with the DC ion-doping apparatus. More specifically, p-type impurities (e.g., B) are added at a high concentration to the active semiconductor layer 11 on both sides of the gate electrode 6, and n-type impurities (e.g., P (phosphorus)) are added at a high concentration to the active semiconductor layer 12 on both sides of the gate electrode 6. These ion-doping steps are selectively performed (i.e., the active semiconductor layer 12 is covered with a resist film when the active semiconductor layer 11 is doped, and the active semiconductor layer 11 is covered with a resist mask when the active semiconductor layer 12 is doped).

Figure 5E:
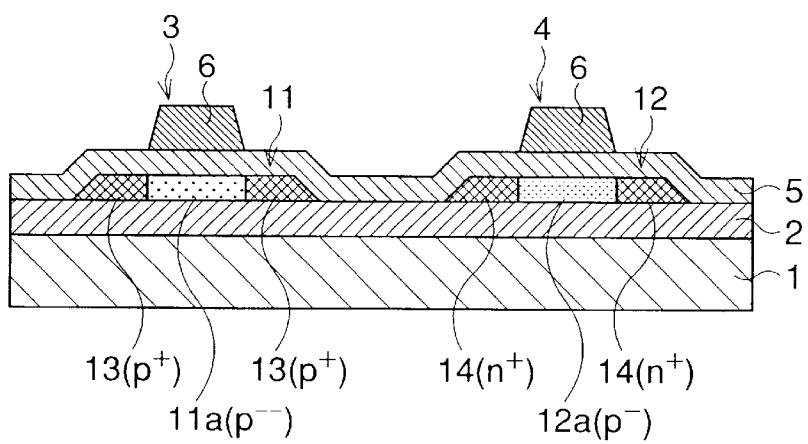

After the resist masks used in the ion-doping steps are removed, excimer laser annealing is performed for the substrate 1. As shown in FIG. 5E, a pair of p-type ($p^+$-type) source and drain 13 is then formed in the active semiconductor layer 11, and a pair of n-type ($n^+$-type) source and drain 14 is also formed in the active semiconductor layer 12. In this manner, a p-type TFT 3 having the gate electrode 6 and the source and drain 13 and an n-type TFT 4 having the gate electrode 6 and the source and drain 14 are formed.

Figure 5F:
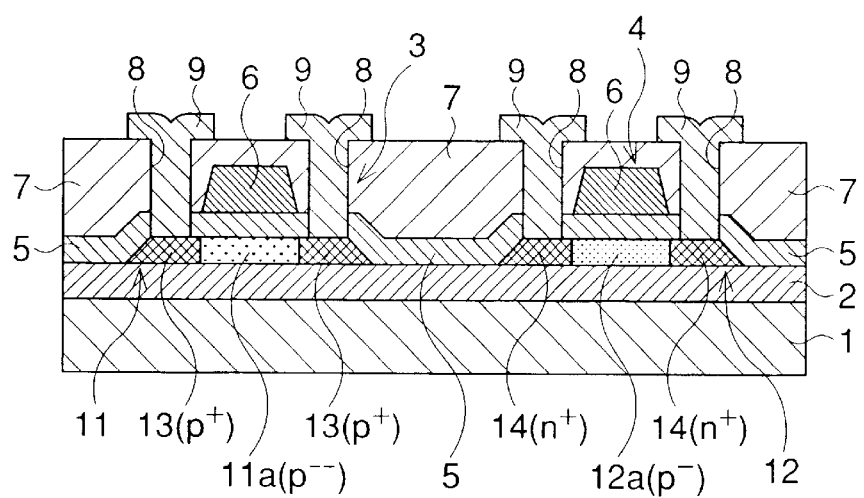

After then, as shown in FIG. 5F, an insulating interlayer 7 such as a silicon nitride film is so formed as to cover the p- and n-type TFTs 3 and 4. Contact holes 8 are formed in the insulating interlayer 7 partially to expose the source/drain pairs 13 and 14. Metal interconnecting layers 9 are then formed by sputtering. These metal interconnecting layers 9 plug the contact holes 8 to be connected to the source/drain pairs 13 and 14, respectively, and extend on the insulating interlayer 7. Fabrication of the principal part of the CMOS-TFT are thus completed. In the completed CMOS-TFT, a channel region 11a of the $p^{--}$-type TFT 3 is p-type, a channel region 12a of the n-type TFT 4 is $p^-$-type, and their threshold voltages (and zero currents) are independently adjusted to their specified values.

In the second embodiment as described above, the threshold voltages (and zero currents) of the p- and n-type TFTs 3 and 4 can be independently adjusted to their specified values with the minimum necessary labor, since no photolithography is required in selectively doping with p-type impurities, by combining two kinds of doping steps with p-type impurities (non-selectively doping and selectively doping).

Besides, in particular, the Vthn of the n-type TFT 4 can be independently and accurately adjusted when the DC ion-doping apparatus capable of doping at a low dose is used in doping with p-type impurities for threshold voltage control.

Several modifications of the CMOS-TFT fabrication method according to the second embodiment will be described below. In these modifications, the same reference numerals as those in the CMOS-TFT of the second embodiment denote the same parts as those of the CMOS-TFT of the second embodiment, and detailed descriptions thereof will be omitted.

First Modification

The first modification will be described below. A CMOS-TFT fabrication method of this first modification is similar to that of the second embodiment but its fabrication steps are slightly different. FIGS. 8A to 8D are schematic sectional views showing the CMOS-TFT fabrication method of the first modification in order of steps.

Figure 8A:
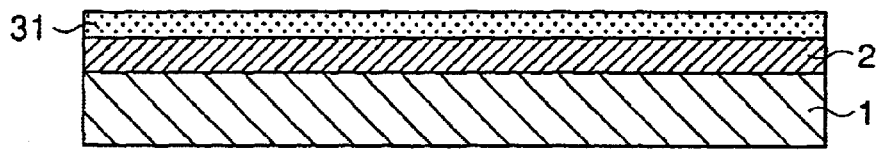
FIGS. 8A to 8D are schematic sectional views showing a CMOS-TFT fabrication method according to the first modification of the second embodiment in order of steps.

First, as shown in FIG. 8A, an insulating underlayer 2 such as a silicon oxide film of a thickness of about 200 to 300 nm is formed on a substrate 1 of, e.g., glass by plasma CVD or sputtering. An amorphous silicon film 31 of a thickness of about 30 to 100 nm is then formed by plasma CVD. Since no impurity is added at this time, the non-doped amorphous silicon film 31 is used as a starting film.

Figure 8B:
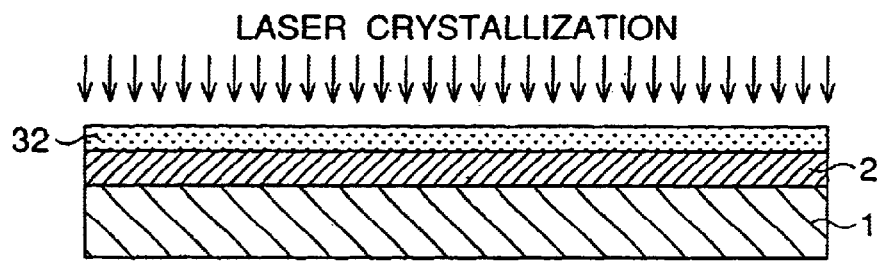

Subsequently, as shown in FIG. 8B, an XeCl excimer laser (wavelength of 308 nm) for emitting a linear laser beam is used to irradiate the amorphous silicon film 31 with 300 to 400 mJ/cm of the laser beam at room temperature in N atmosphere, and thereby, the amorphous silicon film 31 is crystallized to form a non-doped polysilicon film 32.

Figure 8C:
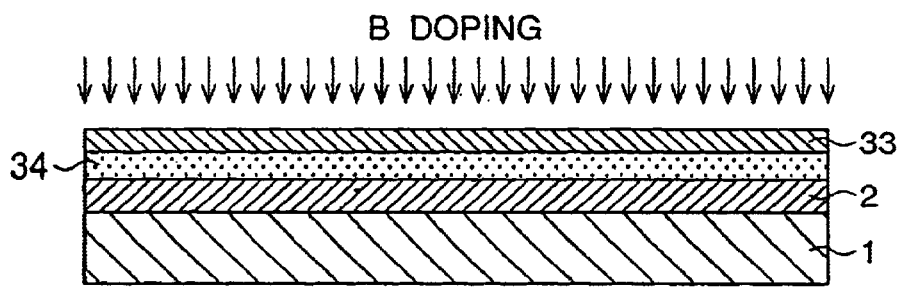

As shown in FIG. 8C, a silicon oxide film is formed as a protective film 33 so as to cover the polysilicon film 32. Next, as the first doping step with p-type impurities for threshold voltage control, a DC ion-doping apparatus is used to perform ion-doping (non-selectively doping) with B of the polysilicon film 32 by using 3% $B_2H_6$ as source gas and adjusting the acceleration voltage to 30 to 80 kV in accordance with the film thickness of the protective film 33. The non-doped polysilicon film 32 is thereby doped with B through the exposed protective film 33 to form a weak p-type ($p^{---}$-type) polysilicon film 34. Since the p-type impurities (B) are thus added, the B concentration distribution becomes broad as shown in FIG. 3C. In consideration of effective controls of the threshold voltages and zero currents, it is preferable that the B concentration in the polysilicon film 32 is $1\times10^{18}/cm^3$ or less, ideally $1\times10^{16}$ to $1\times10^{17}/cm^3$ (or a dose of $1\times10^{11}$ to $1\times10^{13}/cm^2$). Note that the protective film 33 is unnecessary in some cases.

Figure 8D:
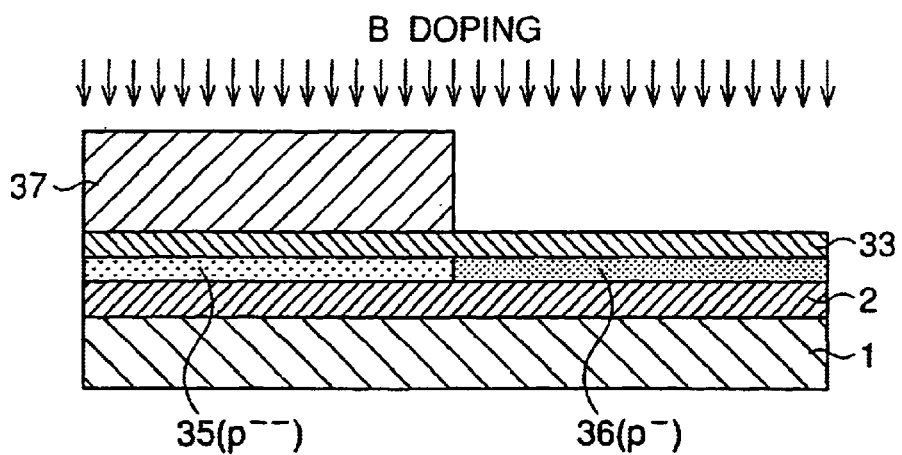

Subsequently, as shown in FIG. 8D, as the second doping step with p-type impurities for threshold voltage control, a resist mask 37 is so formed as to cover only a p-type TFT region 35 of the polysilicon film 34 by photolithography. The DC ion-doping apparatus is used to perform ion-doping (selectively doping) with B under the same dose conditions as those in the second embodiment by using 3% $B_2H_6$ as source gas and adjusting the acceleration voltage to 10 to 30 kV. Only an exposed n-type TFT region 36 of the polysilicon film 34 is thereby doped with B, and its conductivity type changes from $p^-$-type to relatively high p-type ($p^-$-type). The B concentration distribution in the n-type TFT region 36 has a peak near the surface as shown in FIG. 3D.

After the resist mask 37 is removed by ashing with $O_2$ plasma, the substrate 1 is annealed to activate B added to the polysilicon film 34.

Subsequently, photolithography and dry etching are sequentially performed for the p- and n-type TFT regions 35 and 36 of the polysilicon film 34 to form separated island-like active semiconductor layers 11 and 12 as components of p- and n-type TFTs, respectively.

Next, a silicon oxide film of a thickness of about 100 to 120 nm is so deposited by plasma CVD or low-pressure CVD as to cover the active semiconductor layers 11 and 12, and thereby, a gate insulating film 5 is formed.

Subsequently, like the step of FIG. 5E in the second embodiment, a polysilicon film is deposited on the gate insulating film 5 by low-pressure CVD. Photolithography and dry etching are sequentially performed for this polysilicon film to form gate electrodes 6, which extend in the form of bands on the active semiconductor layers 11 and 12.

These gate electrodes 6 are used as masks in doping with the DC ion-doping apparatus. More specifically, p-type impurities (e.g., B) are added at a high concentration to the active semiconductor layer 11 on both sides of the gate electrode 6, and n-type impurities (e.g., P) are added at a high concentration to the active semiconductor layer 12 on both sides of the gate electrode 6. The substrate 1 is then annealed to form a pair of p-type ($p^+$-type) source and drain 13 in the active semiconductor layer 11 and a pair of n-type ($n^+$-type) source and drain 14 in the active semiconductor layer 12. In this manner, a p-type TFT 3 having the gate electrode 6 and the source and drain 13 and an n-type TFT 4 having the gate electrode 6 and the source and drain 14 are formed.

After then, like the step of FIG. 5F in the second embodiment, an insulating interlayer 7 such as a silicon nitride film is so formed as to cover the p- and n-type TFTs 3 and 4. Contact holes 8 are formed in this insulating interlayer 7 partially to expose the source/drain pairs 13 and 14. Metal interconnecting layers 9 are then formed by sputtering. These metal interconnecting layers 9 plug the contact holes 8 to be connected to the source/drain pairs 13 and 14, respectively, and extend on the insulating interlayer 7. Fabrication of the principal part of the CMOS-TFT are thus completed. In the completed CMOS-TFT, a channel region 11a of the p-type TFT 3 is $p^{---}$-type, a channel region 12a of the n-type TFT 4 is $p^-$-type, and their threshold voltages (and zero currents) are independently adjusted to their specified values.

This first modification has the following advantage in addition to the effects achieved by the fabrication method of the second embodiment. That is, in the step shown in FIG. 8D, no such island-like patterns as the active semiconductor layers 11 and 12 exist immediately after the resist mask 37 is removed. As a result, annealing (thermal activation of p-type impurities) can be performed at a relatively high temperature without being influenced by substrate shrinkage.

Besides, the fabrication process can be further simplified because not only selectively doping but also non-selectively doping is performed with the DC ion-doping apparatus.

Second Modification

Figure 9A:
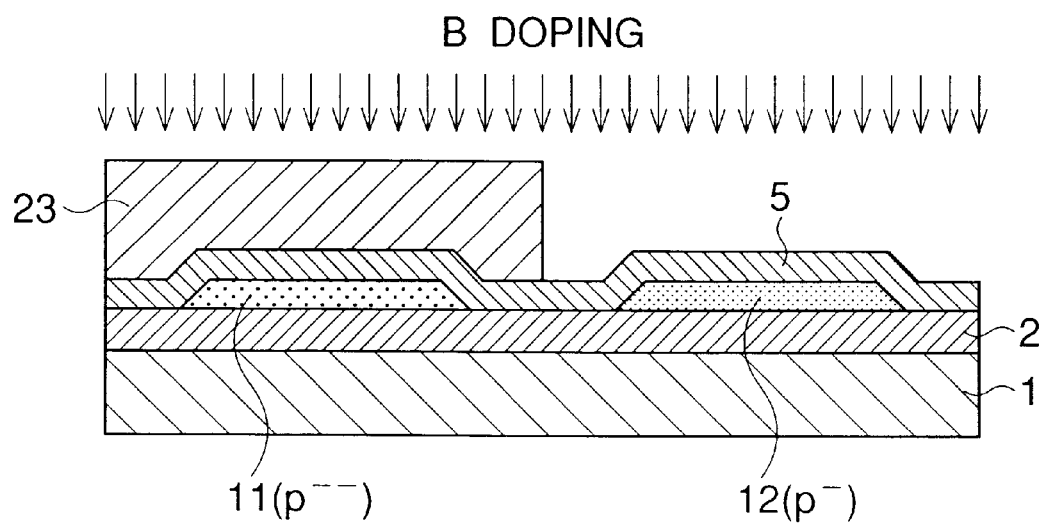
FIGS. 9A and 9B are schematic sectional views showing a CMOS-TFT fabrication method according to the second modification of the second embodiment in order of steps.
Figure 9B:
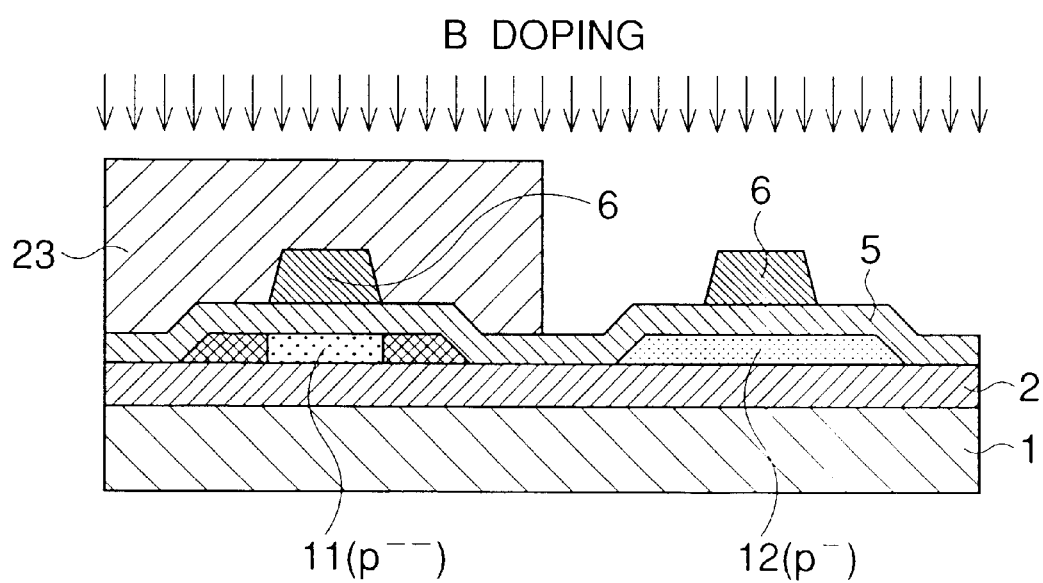

The second modification will be described below. A CMOS-TFT fabrication method of this second modification is similar to that of the second embodiment but its fabrication steps are slightly different. FIGS. 9A and 9B are schematic sectional views showing the CMOS-TFT fabrication method of the first modification in order of steps.

First, like the steps of FIGS. 5A and 5B in the second embodiment, as the first impurity-doping step for threshold voltage control, non-selectively doping with p-type impurities (B) is performed simultaneously with the formation of an amorphous silicon film 2. A $p^{---}$-type polysilicon film 22 is then formed by laser beam irradiation.

Next, photolithography and dry etching are sequentially performed for the $p^{---}$-type polysilicon film 22 to form separated island-like active semiconductor layers 11 and 12 as components of p- and n-type TFTs, respectively.

Subsequently, as shown in FIG. 9A, a silicon oxide film of a thickness of about 100 to 120 nm is so deposited by plasma CVD or low-pressure CVD as to cover the active semiconductor layers 11 and 12, and thereby, a gate insulating film 5 is formed.

A resist mask 23 is so formed by photolithography as to cover only the active semiconductor layer 11. As the second doping step with p-type impurities for threshold voltage control, ion-doping with B (selectively doping) is performed with an acceleration voltage of 10 to 30 kV by using 3% $B_2H_6$ as source gas. In this case, it is necessary to pay attention to contamination, setting the acceleration voltage, and substrate shrinkage during thermal activation.

After then, the resist mask 23 is removed. Like the steps of FIGS. 5E and 5F in the second embodiment, gate electrodes 6 are then formed on the gate insulating film 5 by patterning, and source/drain pairs 13 and 14 are formed. An insulating interlayer 7, contact holes 8, a metal interconnecting film 9 and so on are then formed to complete the principal part of a CMOS-TFT with a p-type TFT 3 and an n-type TFT 4. In the completed CMOS-TFT, a channel region 11a of the p-type TFT 3 is $p^{---}$-type, a channel region 12a of the n-type TFT 4 is $p^-$-type, and their threshold voltages (and zero currents) are independently adjusted to their specified values.

Note that, as shown in FIG. 9B, after the gate insulating film 5 and the gate electrodes 6 are formed, it is also possible to form the resist mask 23 so as to cover only the active semiconductor layer 11 and perform ion-doping (selectively doping) with an acceleration voltage by which the dopants penetrate the gate electrode 6 and stop in the active semiconductor layer 11. Since a high acceleration voltage is set, the mask material and the method of removing the mask material must be designed accordingly. Besides, ion damages can be suppressed with a relatively low acceleration voltage by the use of $BH^+$ ion species.

In this second modification, like the second embodiment, the threshold voltages (and zero currents) of the p- and n-type TFTs 3 and 4 can be independently adjusted to their specified values with the minimum necessary labor, since no photolithography is required in selectively doping with p-type impurities, by combining two kinds of doping steps with p-type impurities (non-selectively doping and selectively doping).

Third Modification

The third modification will be described below. A CMOS-TFT fabrication method of this third modification is similar to that of the second embodiment but a CMOS-TFT has an LDD structure. FIGS. 10A to 10H are schematic sectional views showing the CMOS-TFT fabrication method of the third modification in order of steps.

Figure 10A:
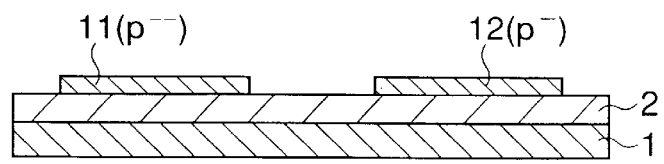
FIGS. 10A to 10H are schematic sectional views showing a CMOS-TFT fabrication method according to the third modification of the second embodiment in order of steps.

First, like the steps of FIGS. 5A to 5C in the second embodiment, non-selectively doping and selectively doping with p-type impurities (B) are performed for threshold voltage control, and thereby, a $p^{---}$-type active semiconductor layer 11 and a $p^-$-type active semiconductor layer 12 are formed (FIG. 10A).

Figure 10B:
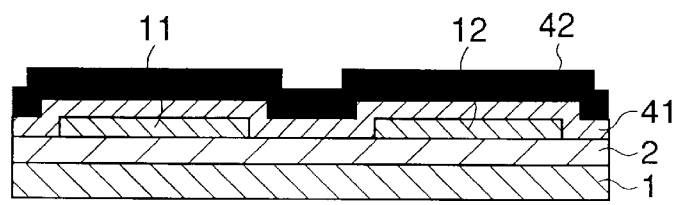

Subsequently, as shown in FIG. 10B, a silicon oxide film 41 of a thickness of about 120 nm is formed as a gate insulating film by plasma CVD so as to cover the active semiconductor layers 11 and 12. An aluminum alloy film 42 of a thickness of about 300 nm is then formed by sputtering to cover the silicon oxide film 41.

Figure 10C:
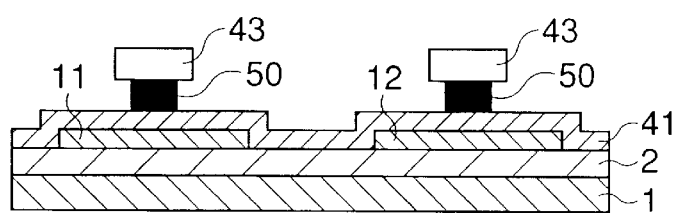

As shown in FIG. 10C, resist masks 43 are formed on the aluminum alloy film 42 by photolithography. The aluminum alloy film 42 is then patterned by dry etching with the resist masks 43 so as to remain in the form of bands on the silicon oxide film 41 above the active semiconductor layers 11 and 12. The aluminum alloy film 42 is then wet-etched (side-etched) by using a predetermined chemical, in this modification, a phosphoric acid-based etching solution, and thereby, the patterns of the aluminum alloy film 42 are slimed by 0.5 to 1.0 μm from the edges of the resist masks 43. Gate electrodes 50 are thus formed.

Figure 10D:
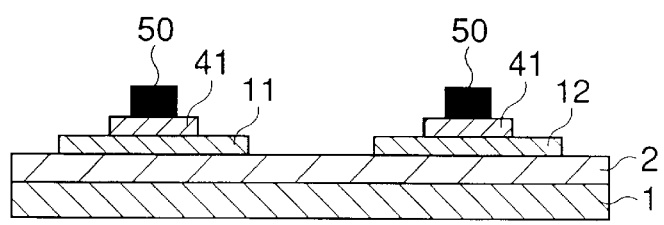

Subsequently, the silicon oxide film 41 is patterned by dry etching (RIE: Reactive Ion Etching) with the resist masks 43. Consequently, as shown in FIG. 10D (which shows the state after the resist masks 43 are removed), staircases are formed of the gate electrodes 50, the silicon oxide film 41, and the active semiconductor layers 11 and 12 narrowing down in this order.

Figure 10E:
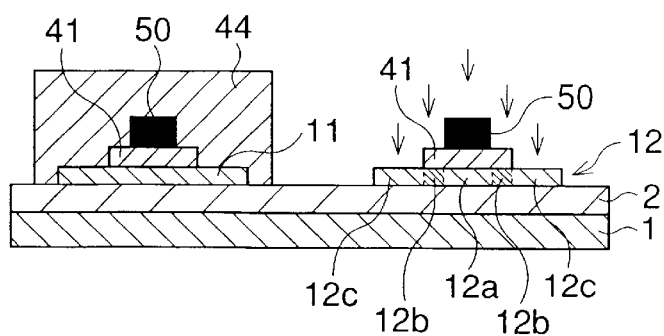

After the resist mask 43 is removed, as shown in FIG. 10E, for further control of the threshold voltages, p-type impurities are selectively added to the channel region of the active semiconductor layer 12 as a component of an n-type TFT. Subsequently, a source and a drain of an LDD structure are formed.

More specifically, a resist mask 44 is formed to cover the active semiconductor layer 11, and the second doping step with p-type impurities (selectively doping) for threshold voltage control is performed only for the active semiconductor layer 12. At this time, ion-doping with B is performed under conditions by which the dopants penetrate the gate electrode 50 and the silicon oxide film 41 and stop in a channel region 12a of the active semiconductor layer 12. For example, the acceleration voltage is 100 kV, and the dose is around $5 \times 10^{14}/cm^2$ so that the concentration is slightly higher (about $1 \times 10^{17}$ to $1 \times 10^{18}/cm^3$) than that by non-selectively doping as described above. The acceleration voltage can also be lowered to the extent of 70 kV by decreasing the thickness (to the extent of, e.g., 200 nm) of the gate electrodes 50 (the aluminum alloy film 42). By this step, only the channel region 12a of the exposed active semiconductor layer 12 is doped with B, and the conductivity type of this portion changes from $p^{---}$-type to relatively high p-type ($p^-$-type). The B concentration distribution in the channel region 12a has a peak near the surface as shown in FIG. 3B.

Next, n-type impurities (e.g., P) is implanted into the exposed active semiconductor layer 12 under conditions by which the dopants penetrate the silicon oxide film 41 and stop in portions of the active semiconductor layer 12 immediately below the silicon oxide film 41. For example, the acceleration voltage is about 70 kV, and the dose is about $1 \times 10^{14}/cm^2$. By this step, n-type regions (LDD regions) 12b are formed in the portions (adjacent to the channel region 12a ($p^-$-type)) of the active semiconductor layer 12 immediately below the silicon oxide film 41.

Impurities of n-type (e.g., P) are again implanted into the exposed active semiconductor layer 12 but under conditions by which the dopants stop in exposed portions of the exposed active semiconductor layer 12 without penetrating the silicon oxide film 41. For example, the acceleration voltage is about 10 kV, and the dose is about $8 \times 10^{15}/cm^2$. By this step, $n^+$-type regions 12c are formed on both sides (outside the $n^-$-type regions 12b) of the active semiconductor layer 12.

Figure 10F:
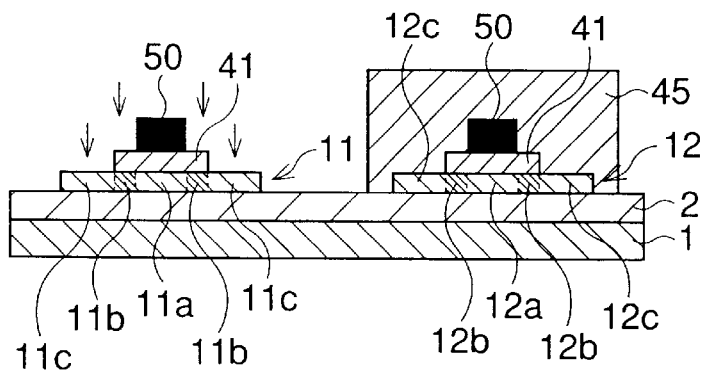

After the resist mask 44 is removed, a resist mask 45 is formed to cover the active semiconductor layer 12 as shown in FIG. 10F. In this state, the active semiconductor layer 11 is doped with p-type impurities (e.g., B) under conditions by which the dopants penetrate the silicon oxide film 41 and stop in portions of the active semiconductor layer 11 immediately below the silicon oxide film 41. For example, the acceleration voltage is about 70 kV, and the dose is about $5 \times 10^{14}/cm^2$. By this step, $p^-$-type regions (LDD region) 11b are formed in the portions (adjacent to a channel region 11a ($p^-$-type)) of the operation semiconductor layer 11 immediately below the exposed silicon oxide film 41.

Impurities of p-type (e.g., B) are again implanted into the exposed active semiconductor layer 11 but under conditions by which the dopants stop in the exposed portions of the active semiconductor layer 11 without penetrating the silicon oxide film 41. For example, the acceleration voltage is about 10 kV, and the dose is about $1 \times 10^{15}/\text{cm}^2$. By this step, p$^+$-type regions 11c are formed on both sides (outside the p$^-$-type regions 11b) of the operation semiconductor layer 11.

Figure 10G:
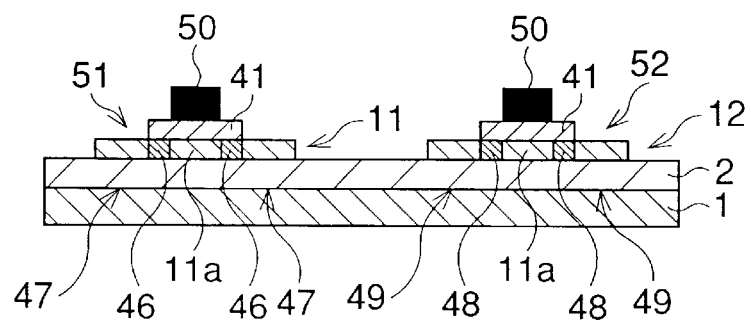

After the resist mask 45 is removed, excimer laser annealing is performed for the substrate 1 as shown in FIG. 10G, to activate the p-type impurity implanted in the channel regions 11a and 12a. This annealing process also activates the p$^-$-type regions 11b and the p$^+$-type regions 11c to form a pair of source and drain 47 including LDD layers 46, and activates the n$^-$-type regions 12b and the n$^+$-type regions 12c to form a pair of source and drain 49 including LDD layers 48. A p-type TFT 51 and an n-type TFT 52 are thus formed.

Figure 10H:
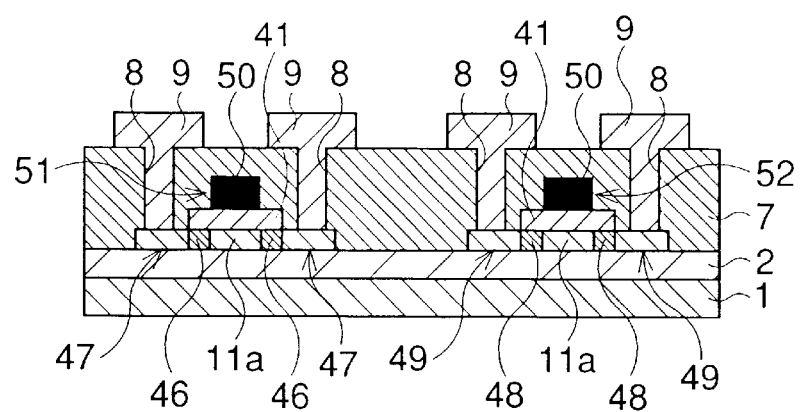

After then, as shown in FIG. 10H, an insulating interlayer 7 such as a silicon nitride film is so formed as to cover the p- and n-type TFTs 51 and 52. Contact holes 8 are formed in this insulating interlayer 7 partially to expose the surfaces of the source/drain pairs 47 and 49. Metal interconnecting layers 9 are then formed by sputtering. These metal interconnecting layers 9 plug the contact holes 8 to be connected to the source/drain pairs 47 and 49, respectively, and extend on the insulating interlayer 7. Fabrication of the principal part of the CMOS-TFT having the LDD structure are thus completed. In the completed CMOS-TFT, the channel region 11a of the p-type TFT 51 is p$^{---}$-type, the channel region 12a of the n-type TFT 52 is p$^-$-type, and their threshold voltages (and zero currents) are independently adjusted to their specified values.

This third modification has the following advantages in addition to the effects achieved by the fabrication method of the second embodiment. That is, since the CMOS-TFT has the LDD layers 48 and 49, leakage current can be reduced, and the device characteristics can be stabilized. Besides, the second doping step with p-type impurities (selectively doping) for threshold voltage control and impurity-doping for forming the source/drain of the LDD structure are continuously performed without forming and removing resist masks. It is therefore possible to fabricate a fine CMOS-TFT with the LDD structure while the threshold voltage control is performed with the minimum number of fabrication steps.

Fourth Modification

The fourth modification will be described below. A CMOS-TFT fabrication method of this fourth modification is similar to that of the third modification but the fabrication steps are slightly different. FIGS. 11A to 11D are schematic sectional views showing the CMOS-TFT fabrication method of the fourth modification in order of steps.

Figure 11A:
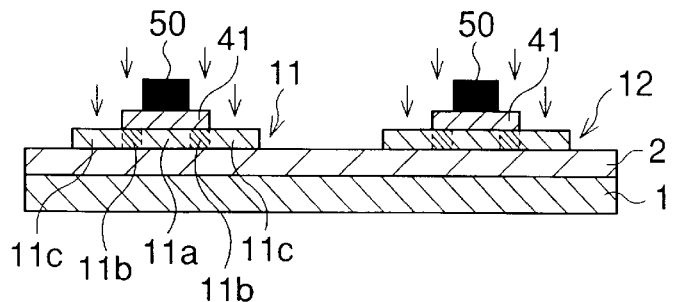
FIGS. 11A to 11D are schematic sectional views showing a CMOS-TFT fabrication method according to the fourth modification of the second embodiment in order of steps.

First, like the steps of FIGS. 5A to 5C in the second embodiment, non-selectively doping and selectively doping with p-type impurities (B) are performed for threshold voltage control, and thereby, a p$^{---}$-type active semiconductor layer 11 and a p$^-$-type active semiconductor layer 12 are formed (FIG. 11A).

Subsequently, like the steps of FIGS. 10B to 10D in the third modification, processes such as photolithography, dry etching, and wet etching are carried out to form staircases of gate electrodes 50, a silicon oxide film (gate insulating film) 41, and the active semiconductor layers 11 and 12 narrowing down in this order.

As shown in FIG. 11A, the whole of the active semiconductor layers 11 and 12 is doped with p-type impurities. More specifically, p-type impurities (e.g., B) are implanted into the active semiconductor layers 11 and 12 under conditions by which the dopants penetrate the silicon oxide film 41 and stop in portions of the active semiconductor layers 11 and 12 immediately below the silicon oxide film 41. For example, the acceleration voltage is about 70 kV, and the dose is about $5 \times 10^{14}/\text{cm}^2$. By this step, p$^-$-type regions (LDD regions) 11b are formed in the portions of the operation semiconductor layer 11 immediately below the exposed silicon oxide film 41. P$^-$-type regions are also formed in the portions of the active semiconductor layer 12 immediately below the exposed silicon oxide film 41.

Impurities of p-type (e.g., B) are again implanted into the exposed active semiconductor layers 11 and 12 but under conditions by which the dopants stop in the exposed portions of the active semiconductor layers 11 and 12 without passing through the silicon oxide film 41. For example, the acceleration voltage is about 10 kV, and the dose is about $1 \times 10^{15}/\text{cm}^2$. By this step, p$^+$-type regions 11c are formed on both sides (outside the p$^-$-type regions 11b) of the operation semiconductor layer 11. P$^+$-type regions are also formed in the portions of the active semiconductor layer 12 immediately below the exposed silicon oxide film 41.

Figure 11B:
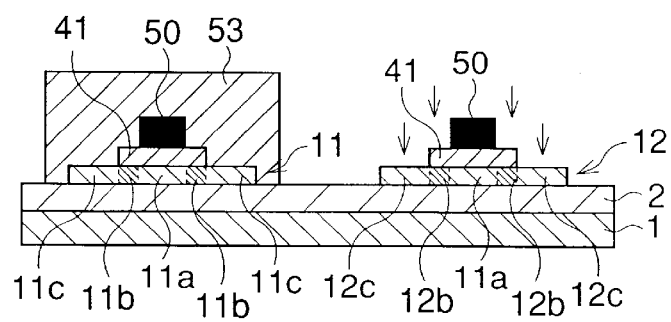

As shown in FIG. 11B, for further control of the threshold voltages, p-type impurities are selectively implanted into the channel region of the active semiconductor layer 12 as a component of an n-type TFT. Subsequently, a source and a drain of an LDD structure are formed.

More specifically, a resist mask 53 is formed to cover the active semiconductor layer 11, and the second doping step with p-type impurities (selectively doping) for threshold voltage control is performed only for the active semiconductor layer 12. In this step, B is implanted under conditions by which the dopants penetrate the gate electrode 50 and the silicon oxide film 41 and stop in a channel region 12a of the active semiconductor layer 12. For example, the acceleration voltage is 100 kV, and the dose is $5 \times 10^{14}/\text{cm}^2$ so that the concentration is slightly higher (about $1 \times 10^{17}$ to $1 \times 10^{18}/\text{cm}^3$) than that by non-selectively doping as described above. The acceleration voltage may also be lowered to the extent of 70 kV by decreasing the thickness (to extent of, e.g., 200 nm) of the gate electrodes 50. By this step, only the channel region 12a of the exposed active semiconductor layer 12 is doped with B, and the conductivity type of this portion changes from p$^{---}$-type to relatively high p-type (p$^-$-type). The B concentration distribution in the channel region 12a has a peak near the surface as shown in FIG. 3B.

Next, n-type impurities (e.g., P) are implanted into the exposed active semiconductor layer 12 under conditions by which the dopants penetrate the silicon oxide film 41 and stop in portions of the active semiconductor layer 12 immediately below the silicon oxide film 41. For example, the acceleration voltage is about 70 kV, and the dose is about $1 \times 10^{14}/\text{cm}^2$ by which the concentration is higher than that at the formation of the p$^-$-type regions 11b. By this step, n$^-$-type regions (LDD regions) 12b are formed, in place of the p$^-$-type regions, in the portions of the active semiconductor layer 12 immediately below the exposed silicon oxide film 41.

Impurities of n-type (e.g., P) are again implanted into the exposed active semiconductor layer 12 but under conditions by which the dopants stop in the exposed portions of the exposed active semiconductor layer 12 without penetrating the silicon oxide film 41. For example, the acceleration voltage is about 10 kV, and the dose is about $8 \times 10^{15}/\text{cm}^2$ by which the concentration is higher than that at the formation of the p$^+$-type regions 11c. By this step, n$^+$-type regions 12c are formed, in place of the p$^+$-type regions, on both sides (outside the n-type regions 12b) of the active semiconductor layer 12.

Figure 11C:
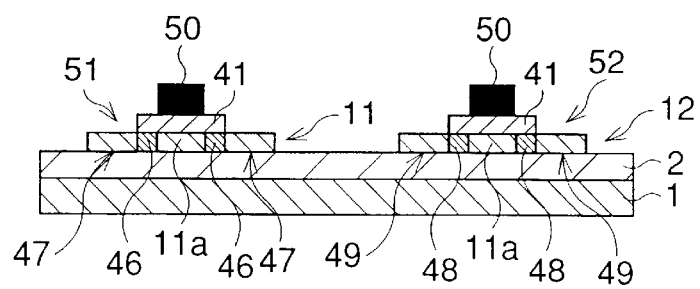

After the resist mask 53 is removed, excimer laser annealing is performed for the substrate 1 as shown in FIG. 11C, to activate p-type impurities in the channel regions 11a and 12a. This annealing process also activates the p⁻-type regions 11b and the p⁺-type regions 11c to form a pair of source and drain 47 having LDD layers 46, and activates the n⁻-type regions 12b and the n⁺-type regions 12c to form a pair of source and drain 49 having LDD layers 48. Besides, this annealing process improves the film quality of the silicon oxide film 41 to operate as a good gate insulating film. A p-type TFT 51 and an n-type TFT 52 are thus formed.

Figure 11D:
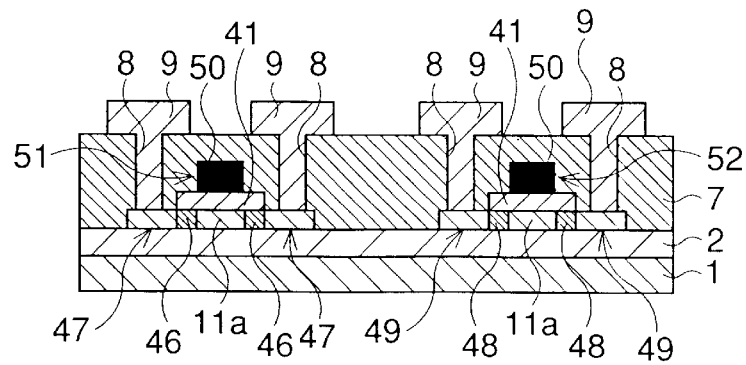

After then, as shown in FIG. 11D, an insulating interlayer 7 such as a silicon nitride film is so formed as to cover the p- and n-type TFTs 51 and 52. Contact holes 8 are formed in this insulating interlayer 7 partially to expose the surfaces of the source/drain pairs 47 and 49. Metal interconnecting layers 9 are then formed by sputtering. These metal interconnecting layers 9 plug the contact holes 8 to be connected to the source/drain pairs 47 and 49, respectively, and extend on the insulating interlayer 7. Fabricating of the principal part of the CMOS-TFT having the LDD structure are thus completed. In the completed CMOS-TFT, the channel region 11a of the p-type TFT 51 is p⁻⁻⁻-type, the channel region 12a of the n-type TFT 52 is p⁻⁻⁻-type, and their threshold voltages (and zero currents) are independently adjusted to their specified values.

This fourth modification has the following advantages in addition to the effects achieved by the fabrication method of the second embodiment. That is, since the CMOS-TFT has the LDD layers 46 and 48, leakage current can be reduced, and the device characteristics can be stabilized. Besides, the second doping step with p-type impurities (selectively doping) for threshold voltage control and the impurity-doping for forming the source/drain of the LDD structure are continuously performed without forming and removing resist masks. It is therefore possible to fabricate a fine CMOS-TFT with the LDD structure while the threshold voltage control is performed with the minimum number of fabrication steps.

Fifth Modification

The fifth modification will be described below. A CMOS-TFT fabrication method of this fifth modification is similar to that of the second embodiment but a CMOS-TFT is so-called bottom gate type. FIGS. 12A to 12F are schematic sectional views showing the CMOS-TFT fabrication method of the fifth modification in order of steps.

Figure 12A:
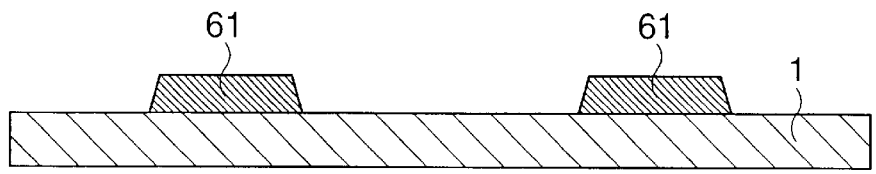
FIGS. 12A to 12F are schematic sectional views showing a CMOS-TFT fabrication method according to the fifth modification of the second embodiment in order of steps.

First, as shown in FIG. 12A, a metal film or alloy film of, e.g., Cr, Ta, Mo, and Al is formed on a substrate 1 by sputtering. Photolithography and dry etching are sequentially performed to form band-like gate electrodes 61 in the prospective regions of p- and n-type TFTs by patterning.

Figure 12B:
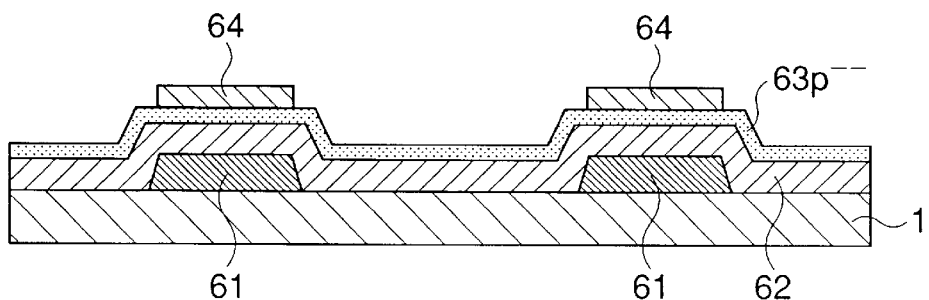

Subsequently, as shown in FIG. 12B, a single-layered silicon oxide film ($SiO_2$) or silicon nitride film ($SiN_x$), a multilayered silicon oxide film ($SiO_x$), or a multilayered insulating film of $SiN_x$ (upper layer)/$SiO_2$ (lower layer), of a thickness of about 300 to 400 nm, preferably, 300 to 350 nm, is so formed by plasma CVD or low-pressure CVD as to cover the gate electrodes 61, and thereby, a gate insulating film 62 is formed. An amorphous silicon film 63 of a thickness of about 30 to 100 nm is then formed by plasma CVD. In this film formation, a very small amount of 5 to 6 ppm (gas ratio) of $B_2H_6$ is added to $SiH_4$ as source gas as the first doping step with p-type impurities (non-selectively doping) for threshold voltage control, and thereby, the amorphous silicon film 63 as a weak p-type (p⁻⁻⁻-type) starting film is formed. Since the p-type impurities (B) are added simultaneously with the film formation, the B concentration distribution is flat as shown in FIG. 3A. For effective control of the threshold voltages and zero currents, the B concentration in the p⁻⁻⁻-type amorphous silicon film 63 is preferably 1 to 10 ppm (or $1 \times 10^{18}/cm^3$ or less, ideally, $1 \times 10^{16}$ to Next, a silicon oxide film is deposited on the p⁻⁻⁻-type amorphous silicon film 63 by plasma CVD or low-pressure CVD. Photolithography and dry etching are sequentially performed for this silicon oxide film to form a protective film 64 of a thickness of about 50 to 100 nm such that the silicon oxide film remains only in portions above the gate electrodes 61 in the prospective regions of p- and n-type TFTs. Note that this protective film 64 is unnecessary in some cases.

Figure 12C:
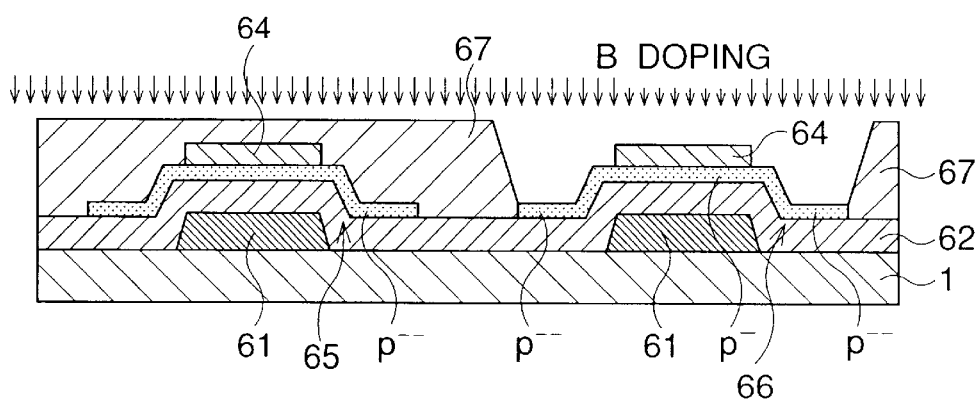

As shown in FIG. 12C, excimer laser annealing is performed to crystallize the p⁻⁻⁻-type amorphous silicon film into a p⁻⁻⁻-type polysilicon film. This p⁻⁻⁻-type polysilicon film is patterned into the form of islands in the prospective regions of p- and n-type TFTs, and thereby, active semiconductor layers 65 and 66 are formed. A resist mask 67 is so formed as to expose only the active semiconductor layer 66. As the second doping step with p-type impurities for threshold voltage control, a DC ion-doping apparatus is used to perform ion-doping (selectively doping) with B by using 1% to 3% $B_2H_6$ as source gas. The acceleration voltage of this step is adjusted to about 30 to 60 kV because the dopants must penetrate the protective film 64 but stop in the active semiconductor layer 66. By this step, only the exposed active semiconductor layer 66 is doped with B, and its conductivity type changes from p⁻⁻⁻-type to relatively high p-type (p⁻-type). The B concentration distribution in the active semiconductor layer 66 has a peak near the surface as shown in FIG. 3B.

Figure 12D:
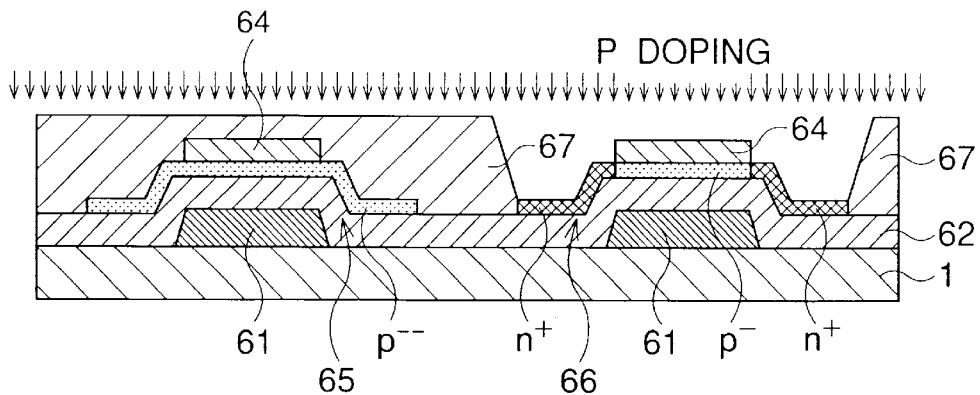

Next, as shown in FIG. 12D, n-type impurities (e.g., P) are implanted at a high concentration into exposed portions (i.e., portions on both sides of the protective film 64) of the active semiconductor layer 66 with an acceleration voltage by which the dopants do not penetrate the protective film 64. For example, the acceleration voltage is about 5 to 20 kV, preferably, about 10 kV.

Figure 12E:
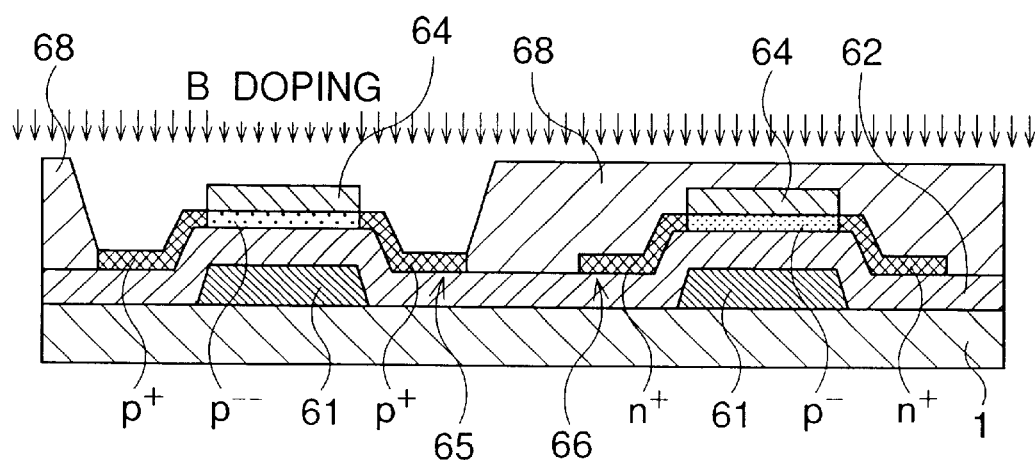

After the resist mask 67 is removed, a resist mask 68 is so formed as to expose only the active semiconductor layer 65 as shown in FIG. 12E. Impurities of p-type (e.g., B) are implanted at a high concentration into exposed portions (i.e., portions on both sides of the protective film 64) of the active semiconductor layer 65 with an acceleration voltage by which the dopants do not penetrate the protective film 64. For example, the acceleration voltage is about 5 to 20 kV, preferably, about 10 kV.

After the resist mask 68 is removed, excimer laser annealing is performed for the substrate 1 to activate p-type impurities in channel regions 65a and 66a. Activation by this annealing process also forms a pair of p-type (p⁺-type) source and drain 73 and a pair of n-type (n⁺-type) source and drain 74. A p-type TFT 71 and an n-type TFT 72 are thus completed.

Figure 12F:
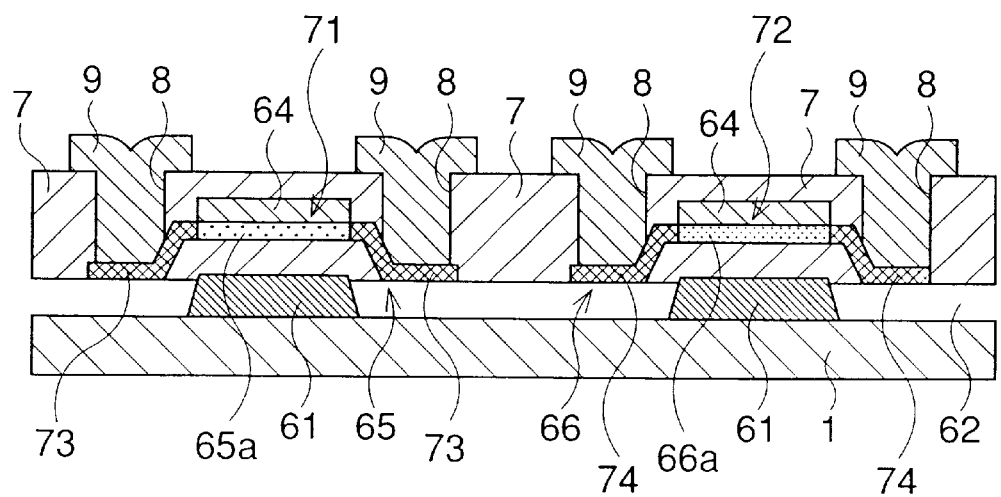

After then, as shown in FIG. 12F, an insulating interlayer 7 such as a silicon nitride film is so formed as to cover the p- and n-type TFTs 71 and 72. Contact holes 8 are formed in this insulating interlayer 7 partially to expose the surfaces of the source/drain pairs 73 and 74. Metal interconnecting layers 9 are then formed by sputtering. These metal interconnecting layers 9 plug the contact holes 8 to be connected to the source/drain pairs 73 and 74, respectively, and extend on the insulating interlayer 7. Fabrication of the principal part of the CMOS-TFT including the p- and n-type TFTs 71 and 72 are thus completed. In the completed CMOS-TFT, the channel region 65a of the p-type TFT 71 is p⁻⁻-type, the channel region 66a of the n-type TFT 72 is p⁻-type, and their threshold voltages (and zero currents) are independently adjusted to their specified values.

In this fifth modification, like the second embodiment, the threshold voltages (and zero currents) of the p- and n-type TFTs 71 and 72 can be independently adjusted to their specified values with the minimum necessary labor, since no photolithography is required in selectively doping with p-type impurities, by combining two kinds of doping steps with p-type impurities (non-selectively doping and selectively doping).

Third Embodiment

The third embodiment of the present invention will be described below with reference to FIGS. 13 to 23. In this third embodiment, the present invention is applied to a liquid crystal display integrated with peripheral circuits including CMOS-TFTs.

Figure 13:
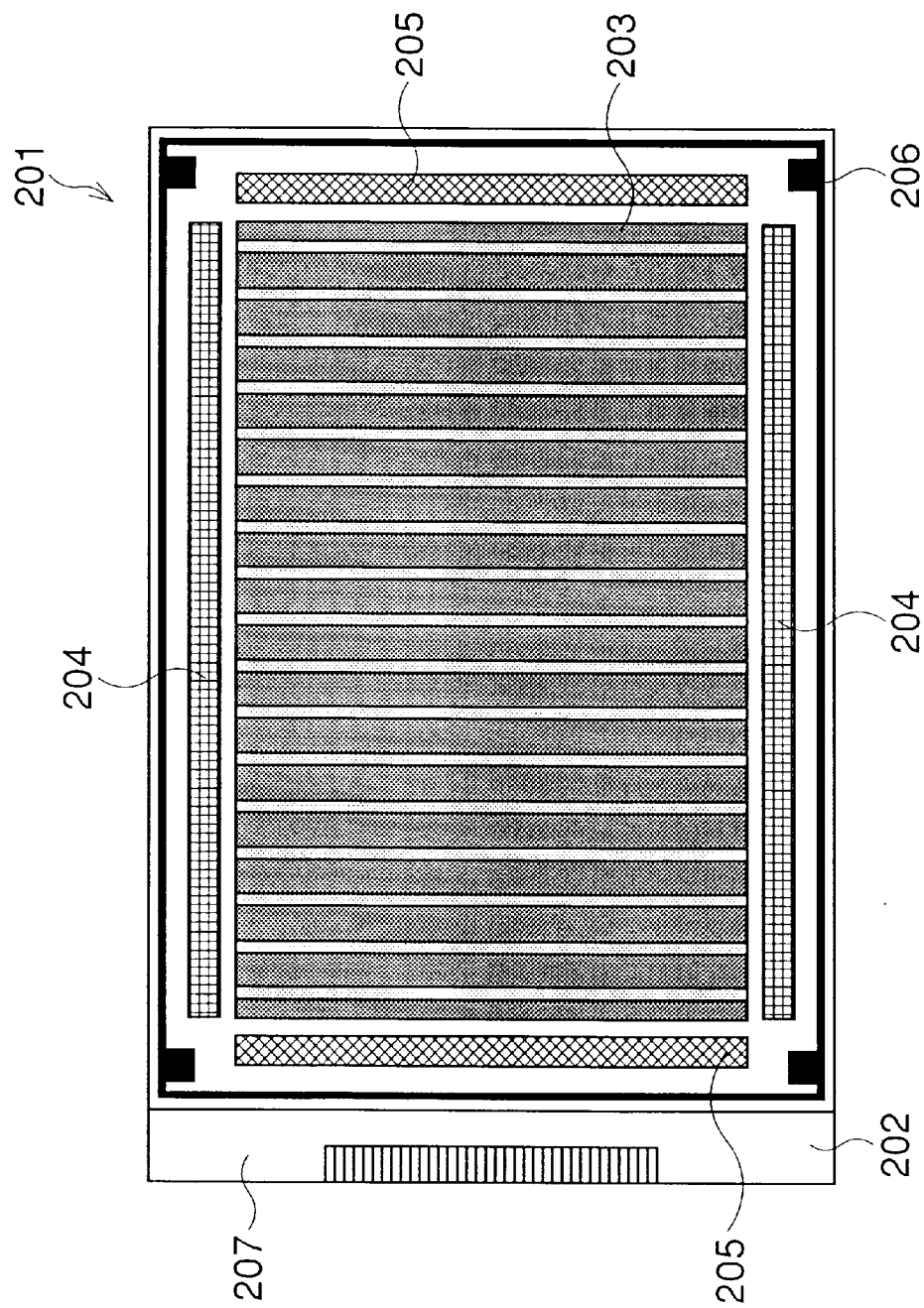
FIG. 13 is a schematic plan view showing the main components of a liquid crystal display according to the third embodiment.

FIG. 13 is a plan view showing the whole configuration of an SVGA liquid crystal display 201 according to the third embodiment (hereinafter, simply called liquid crystal display 201) using a low-temperature polysilicon film and integrated with peripheral circuits.

As shown in FIG. 13, this liquid crystal display 201 comprises a display unit 203, a signal-driving circuit 204, a gate-driving circuit 205, a common electrode 206, and an extracting terminal 207, all of which are formed on a TFT substrate 202.

Figure 14:
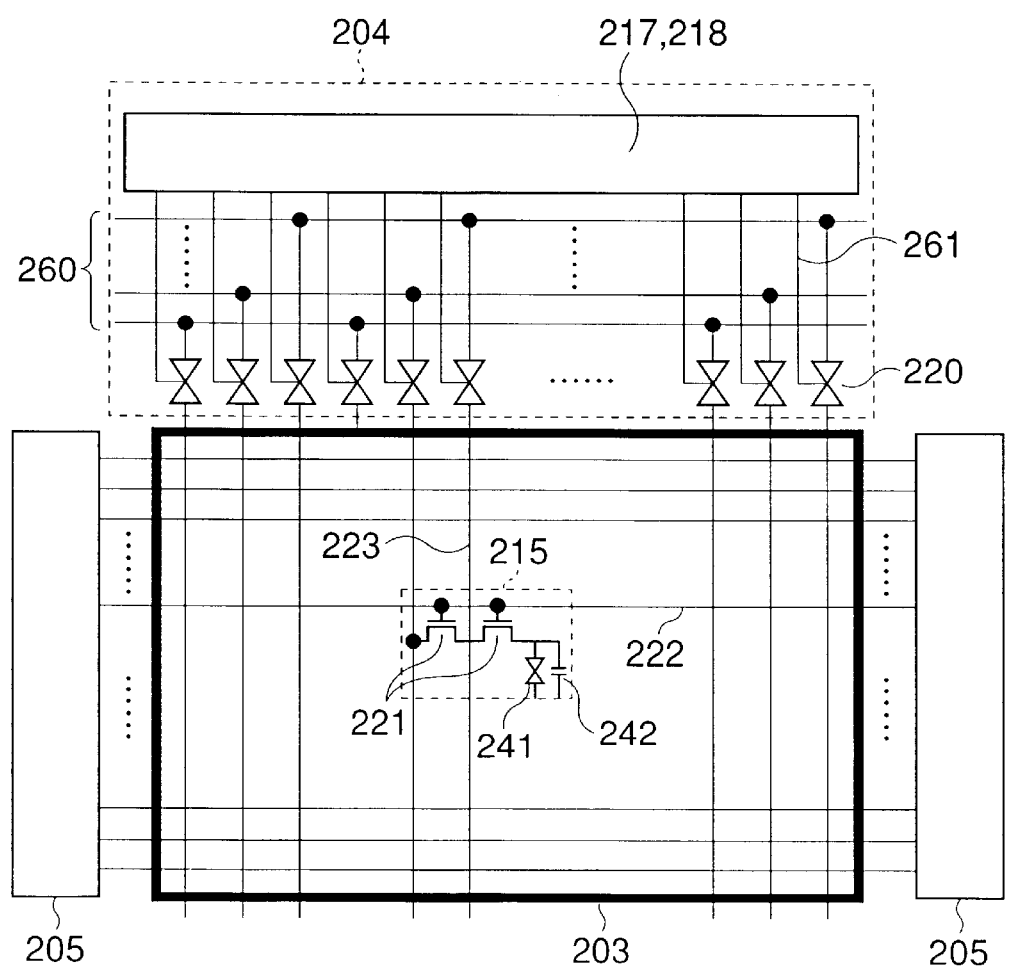
FIG. 14 is a schematic plan view showing the principal part of each driving circuit of the liquid crystal display.

FIG. 14 is a plan view showing details of the display unit 203, the signal-driving circuit 204, and the gate-driving circuit 205 of the liquid crystal display 201. The pixel format of the display unit 203 is composed of 800×RGB×600. Display data is divided into eight portions (for each RGB), and the number of video signal lines 260 is 24 (8×RGB). The signal-driving circuit 204 has 100 shift registers, and its operating frequency is f=6.88 MHz. The gate driving circuit 205 has 150 shift registers, and its operating frequency is f=40 kHz. Analog switch control signals 261 as outputs from the signal driving circuit 204 are connected to analog switches 220 to control the connections between the video signal lines 260 and signal lines 223 running in a column direction of the display unit 203. Outputs from the gate driving circuit 205 are connected to scan lines 222 running in a row direction of the display unit 203.

The principal part of the liquid crystal display 201 shown in FIG. 14 will be described below.

Figure 15:
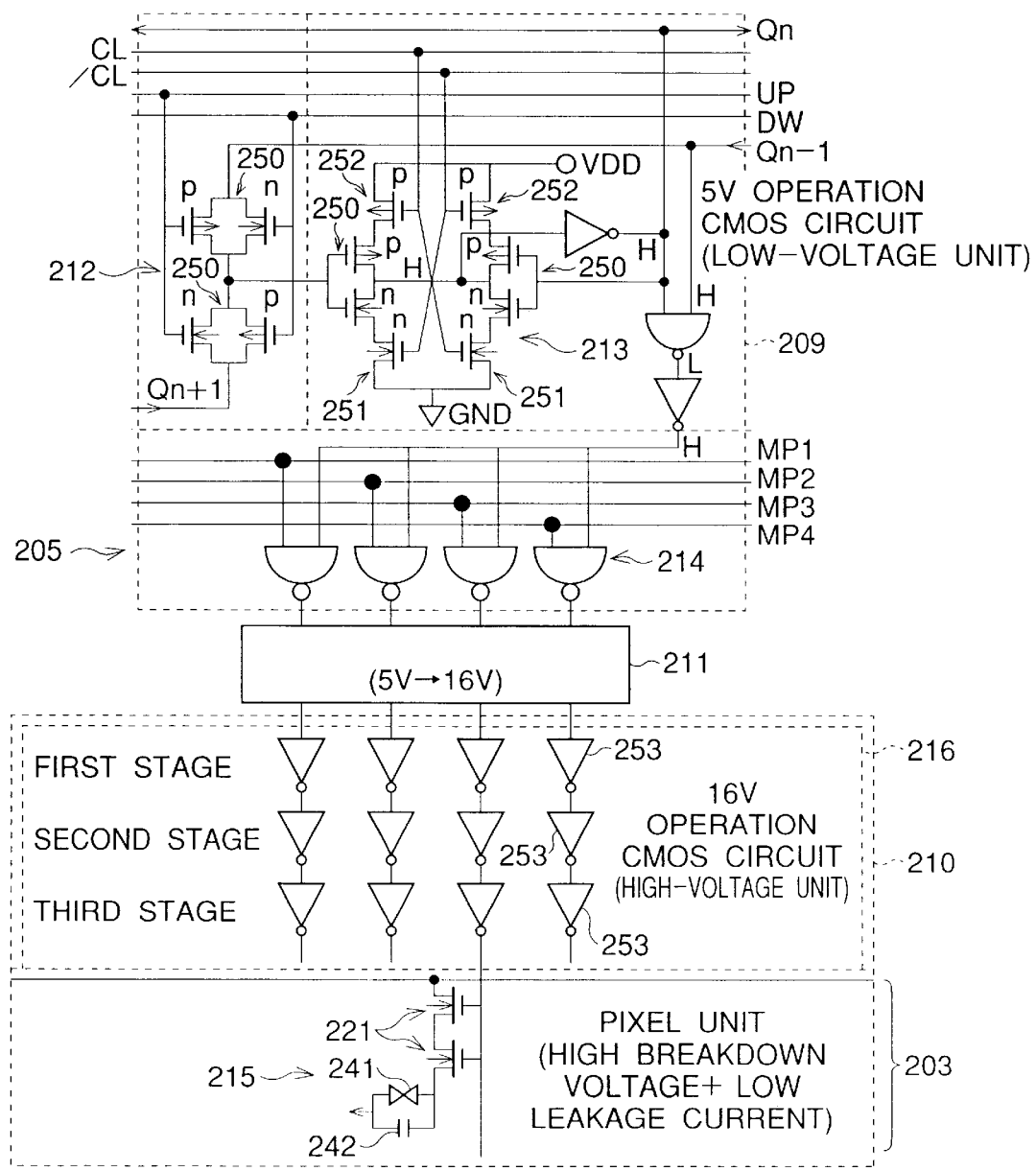
FIG. 15 is a schematic plan view showing the principal part of a gate driving circuit of the liquid crystal display.

The configuration of the gate-driving circuit 205 will be described first. FIG. 15 is a circuit diagram showing the gate-driving circuit 205 of the liquid crystal display 201 shown in FIG. 14. The gate-driving circuit 205 is roughly divided into low- and high-voltage units.

Referring to FIG. 15, a low-voltage unit 209 and a high-voltage unit 210 are formed with a level converter 211 between them. The low-voltage unit 209 is a CMOS circuit which operates at 5 V. The high-voltage unit 210 is a CMOS circuit which operates at 16 V. Outputs from this high-voltage circuit 210 are connected to pixel cells 215 in the display unit 203. That is, the display unit 203 belongs to the high-voltage unit driven at 16 V. The driving voltage of the low-voltage unit 209 is boosted to 16 V and supplied to the high-voltage unit 210 by the level converter 211.

The low-voltage unit 209 includes bidirectional switches 212, shift registers 213, and multiplexers 214. As shown in FIG. 15, the bidirectional switches 212 and the shift registers 213 are constructed of CMOS circuits including CMOS-TFTs 250 each having n- and p-type TFTs, n-type TFTs 251, and p-type TFTs 252. The multiplexers 214 are also constructed of CMOS circuits.

The high-voltage unit 210 has a buffer unit 216 in which three stages of CMOS-TFTs 253 are connected. The buffer unit 216 increases the load-driving power of a signal from the level converter 211 and connects the signal to each pixel cell 215 in the display unit 203. In such a CMOS buffer having a plurality of stages, even-numbered stages and odd-numbered stages operate differently. So, different TFTs control the tunneling current.

Figure 16A:
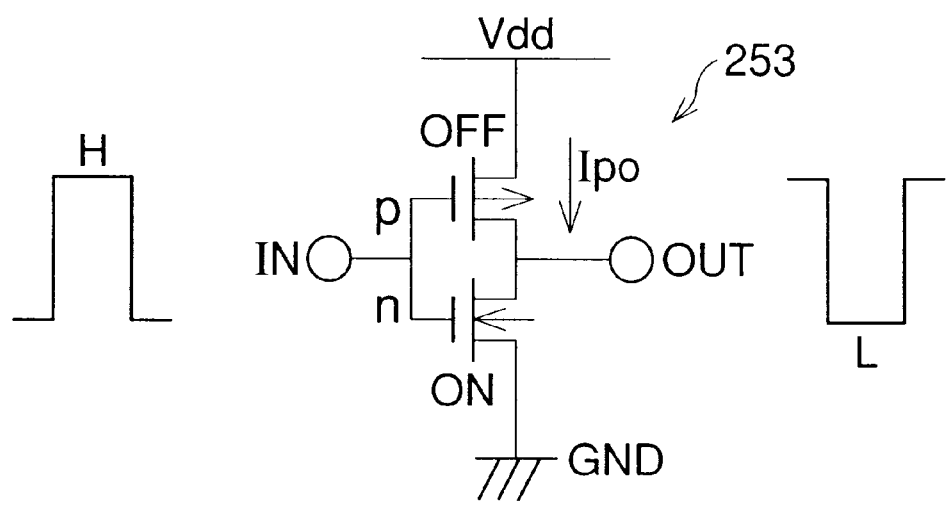
FIGS. 16A and 16B are circuit diagrams for explaining the function of a CMOS-TFT as one component of the liquid crystal display.
Figure 16B:
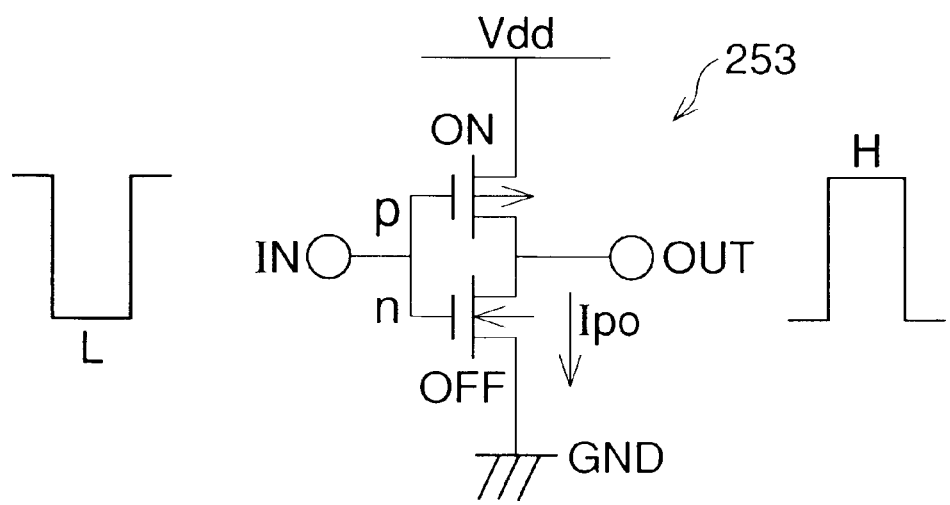

FIGS. 16A and 16B are diagrams for explaining the functions of the CMOS-TFTs 253 constructing the buffer unit 216. FIG. 16A shows the CMOS-TFT 253 in the first stage. When a signal H is applied to an input terminal (IN), the p-type TFT of the CMOS-TFT 253 is turned off, and its n-type TFT is turned on. Consequently, an output terminal (OUT) is connected to GND and outputs a signal L. As the tunneling current, very small amount of zero current Ip0 flows through the p-type TFT in the OFF state.

FIG. 16B shows the CMOS-TFT 253 in the second stage. When a signal L is applied to an input terminal (IN), the p-type TFT of the CMOS-TFT 253 is turned on, and its n-type TFT is turned off. Hence, Vdd is applied to an output terminal (OUT), and the signal H is output. As the tunneling current, a very small amount of zero current In0 flows through the n-type TFT in the OFF state. The zero currents Ip0 and In0 can be adjusted to their specified values by a threshold voltage control method (to be described later).

Figure 17:
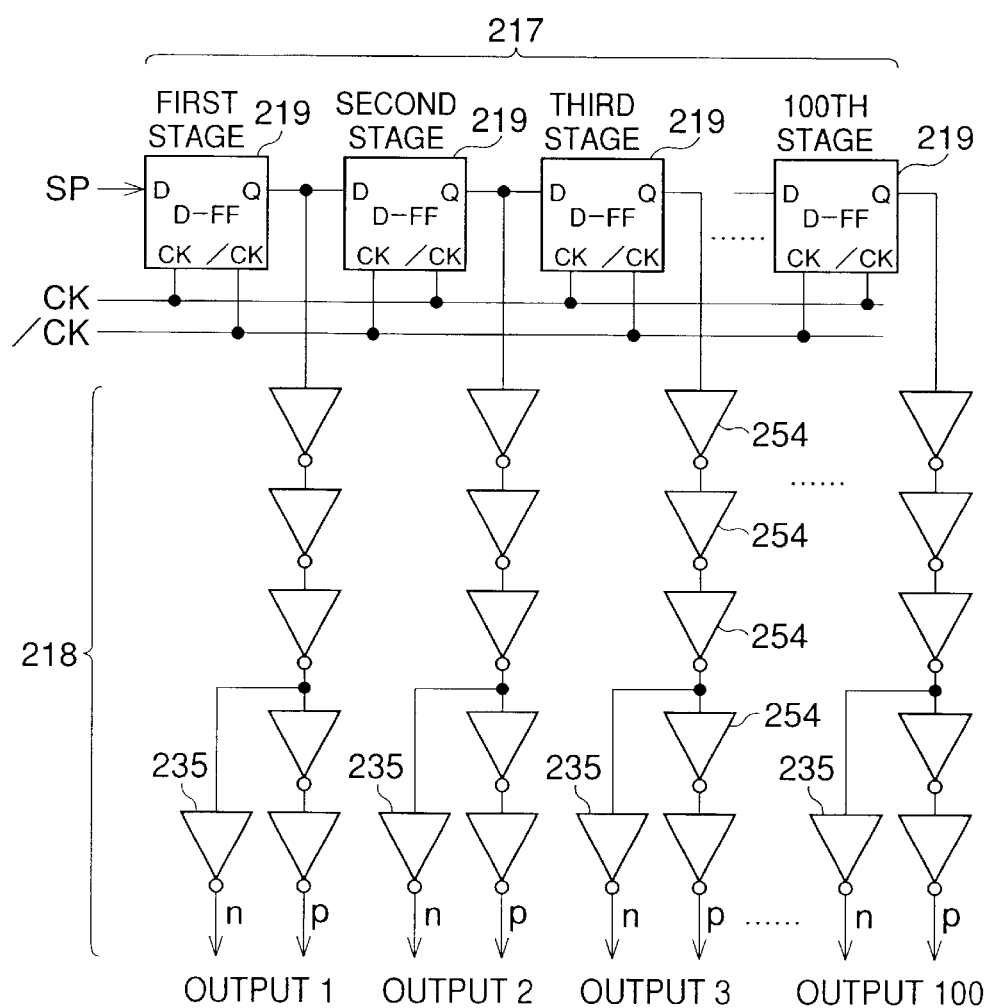
FIG. 17 is a circuit diagram showing the main components of a shift register and a buffer in a signal driving circuit of the liquid crystal display.

The configuration of the signal-driving circuit 204 will be described next. FIG. 17 is a circuit diagram showing the signal-driving circuit 204 of the liquid crystal display 201 shown in FIG. 14.

Figure 18A:
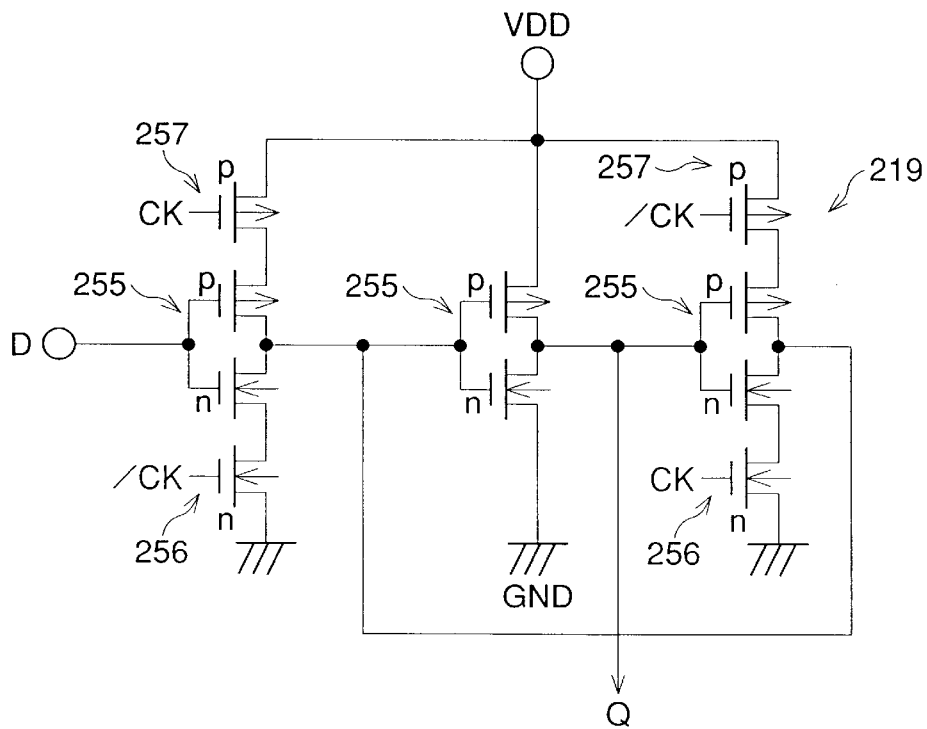
FIGS. 18A and 18B are circuit diagrams showing the main components of a flip-flop of the shift register and the buffer in the signal driving circuit of the liquid crystal display.
Figure 18B:
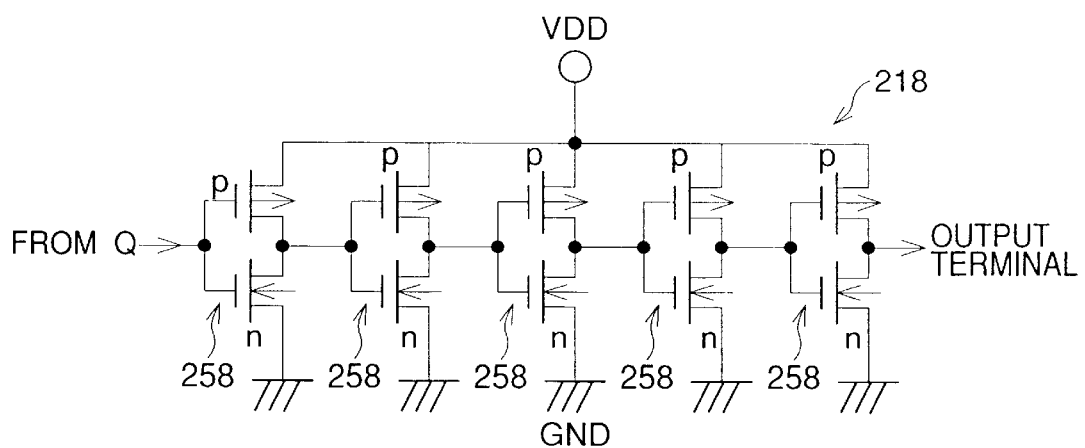

The signal-driving circuit 204 is constructed of a shift register 217 and a buffer unit 218 shown in FIGS. 18A and 18B, respectively, and the analog switches 220 shown in FIG. 14. First, the arrangement of the shift register 217 will be described with reference to FIG. 17.

As shown in FIG. 17, the shift register 217 is composed of 100 flip-flops (D-FFs) 219 aligned in the horizontal direction. Each flip-flop 219 has an input terminal D and an output terminal Q and receives clocks CK and/CK. The input terminals D of the second and subsequent flip-flops 219 are respectively connected to the output terminals Q of the adjacent flip-flops 219.

An output from the output terminal Q of each flip-flop 219 is applied to the buffer unit 218. Like the buffer unit 216 of the gate driving circuit 205, a plurality of stages of CMOS-TFTs 254 is connected in the buffer unit 218.

An input to the second last CMOS-TFT 254 of the buffer unit 218 is also connected to the input of a CMOS-TFT 235, that is, each output from the buffer unit 218 is branched into two signals. These two output signals from the buffer unit 218 are connected to transfer gates 240 of each analog switch 220 shown in FIG. 14.

FIG. 18A shows the circuit configuration of one flip-flop 219 constructing the shift register 217. This flop-flop 219 includes CMOS-TFTs 255, n-type TFTs 256, and p-type TFTs 257 and supplies an output Q corresponding to an input D in synchronism with the clocks CK and/CK. That is, in FIG. 17, an input SP to the first flip-flop 219 is shifted to the second and third flip-flops 219 at the timings of the clocks CK and/CK.

FIG. 18B shows the circuit configuration of the buffer unit 218. This buffer unit 218 includes five CMOS-TFTs 258 and has the same function as the buffer unit 216, i.e., delays a signal from the flip-flop 219 and increases the load-driving power of the signal. Note that the CMOS-TFTs 235 described above are omitted from FIG. 18B.

Figure 19:
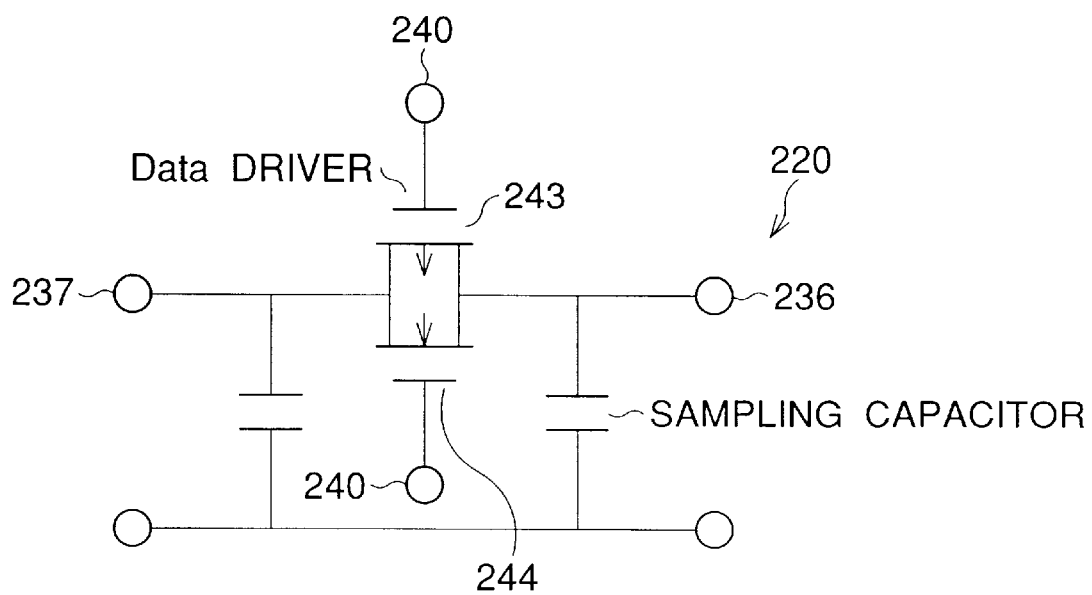
FIG. 19 is a circuit diagram showing the principal part of an analog switch in the signal driving circuit of the liquid crystal display.

FIG. 19 shows the arrangement of the analog switch 220 connected to the output of the buffer 218. This analog switch 220 is a switching circuit having a transfer gate structure including an n-type TFT 244 and a p-type TFT 243. The two branched outputs from the buffer unit 218 are connected to two transfer gates 240. Referring to FIG. 19, a terminal 236 is connected to the video signal line 260 shown in FIG. 14, and a terminal 237 is connected to the signal line 223 which is connected to the pixel cell 215. When the outputs from the buffer unit 218 are transmitted to the transfer gates 240, the analog switch 220 is turned on to transmit an output from the video signal line 260 to the signal line 223.

The arrangement of each pixel cell 215 connected to the outputs of the signal driving circuit 204 and the gate driving circuit 205 will be described below. As shown in FIG. 14, each pixel cell 215 includes a liquid crystal cell 241, two pixel TFTs 221, and a capacitor 242 connected in parallel with the liquid crystal cell 241. The pixel TFTs 221 are n-type TFTs whose gate electrodes are connected to the same scan line 222 from the gate-driving circuit 205 and applied with a high voltage of 16 V. The drain of one pixel TFT 221 is connected to the signal line 223 from the signal-driving circuit 204.

When a signal is transmitted to the scan line 222 via the buffer unit 216 of the gate-driving circuit 205 and the analog switch 220 is turned on by a signal from the signal-driving circuit 204, a signal from the video signal line 260 is transmitted to the liquid crystal cell 241 via the pixel TFTs 221. Consequently, the whole of the display unit 203 displays an image or the like.

As described above, in this liquid crystal display 201, the pixel TFTs 221 constructed of two n-type TFTs to which a high voltage of 16 V is applied are formed in the display unit 203. The gate-driving circuit 205 includes the low-voltage unit 209 having CMOS-TFTs to which a low voltage of 5 V is applied and the high-voltage unit 210 having CMOS-TFTs to which a high voltage of 16 V is applied. The signal-driving circuit 204 also includes CMOS-TFTs having different operating voltages. That is, the CMOS-TFTs and the pixel TFTs 221 of the liquid crystal display 201 are classified into two element groups (a low-voltage element group and a high-voltage element group) in accordance with their operating voltages. CMOS-TFTs in these different element groups have different optimum threshold voltages (specified values) in accordance with their operating voltages. For this reason, it is extremely difficult to adjust the threshold voltages of these CMOS-TFTs (and the pixel TFTs 221) to the specified values.

In this embodiment, therefore, a threshold voltage control method to be described below as a characteristic feature of the present invention is applied to the liquid crystal display in which the two element groups have different specified values of the threshold voltage. In the following description, non-selectively doping means that p-type impurities are added at a very low concentration into the whole of p- and n-type regions of each CMOS-TFT in a corresponding element group, and selectively doping means that p-type impurities are added at a low concentration only into an n-type region of each CMOS-TFT in a corresponding element group.

FIGS. 20 and 21 are graphs showing Id-Vg curves which change in accordance with doping with p-type impurities.

Figure 20A:
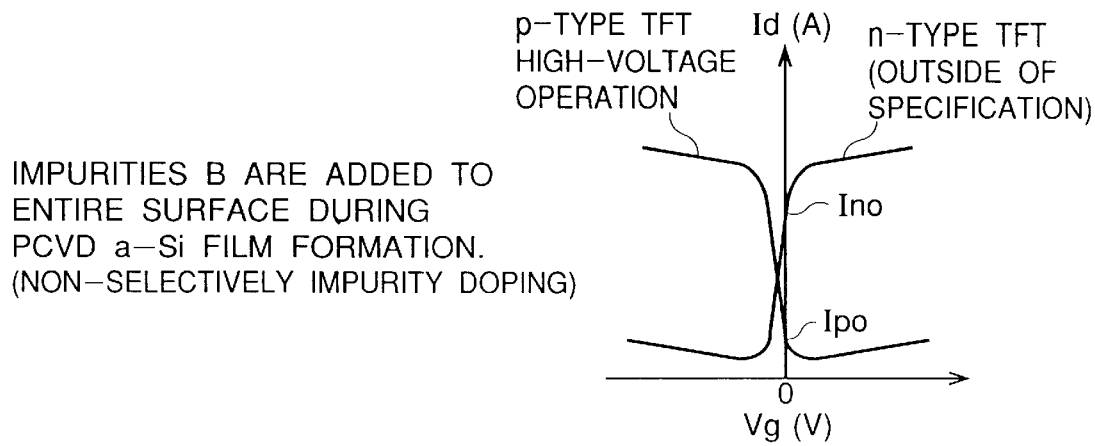
FIGS. 20A and 20B are graphs for explaining the principle of setting the threshold voltages of a CMOS-TFT and a pixel TFT in accordance with the circuit functions.

First, in the prospective regions of CMOS-TFTs (low- and high-voltage operation CMOS-TFTS) forming the low- and high-voltage element groups and the pixel TFTs 221, p-type impurities (B) are added in the form of gas ($B_2H_6$: 5 ppm) simultaneously with the formation of an amorphous silicon film like the second embodiment. FIG. 20A shows the Id-Vg curves in this state. As shown in FIG. 20A, the threshold voltage (Vthp) of the p-type TFT of the high-voltage operation CMOS-TFT, regardless of whether the CMOS-TFT is in the low- or high-voltage element group, is adjusted to the specified value. The Id-Vg curve of the n-type TFT is, however, still shifted in the negative direction, and the threshold voltage (Vthn) is outside the specified value.

Figure 20B:
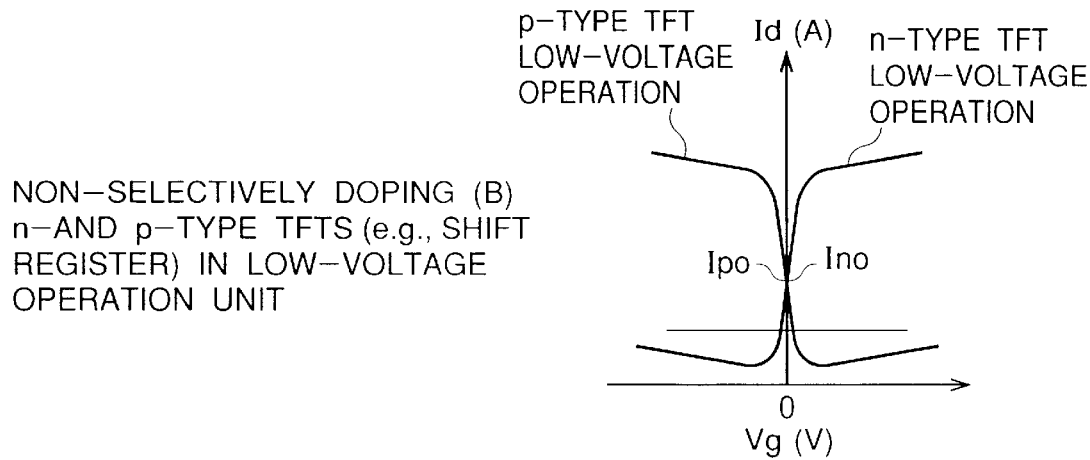

Subsequently, non-selectively doping with p-type impurities (B) is performed only for the prospective region of the low-voltage operation CMOS-TFT. This non-selectively doping process is carried out at a dose of about 1 to $5 \times 10^{12}/cm^2$ with a DC ion-doping apparatus. FIG. 20B shows the Id-Vg curves of the low-voltage operation CMOS-TFT in this state. As shown in FIG. 20B, the Id-Vg curves of both of the p- and n-type TFTs shift in the positive direction to adjust the threshold voltages (Vthp and Vthn) of both TFTs to the specified values. In this state, to realize a high operating speed, the p- and n-type TFTs of the low-voltage operation CMOS-TFT reach the specified values with higher zero currents (Ip0 and In0: Ip0≈In0 (ideally, Ip0=In0)) than those of the high-voltage operation CMOS-TFT.

Figure 21A:
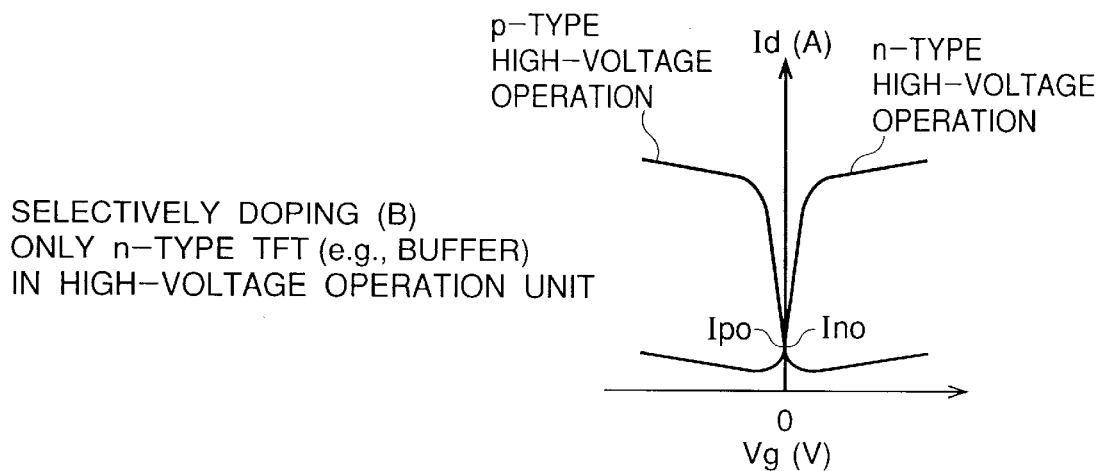
FIGS. 21A and 21B are graphs for explaining the principle of setting the threshold voltages of a CMOS-TFT and a pixel TFT in accordance with the circuit functions.
Figure 21B:
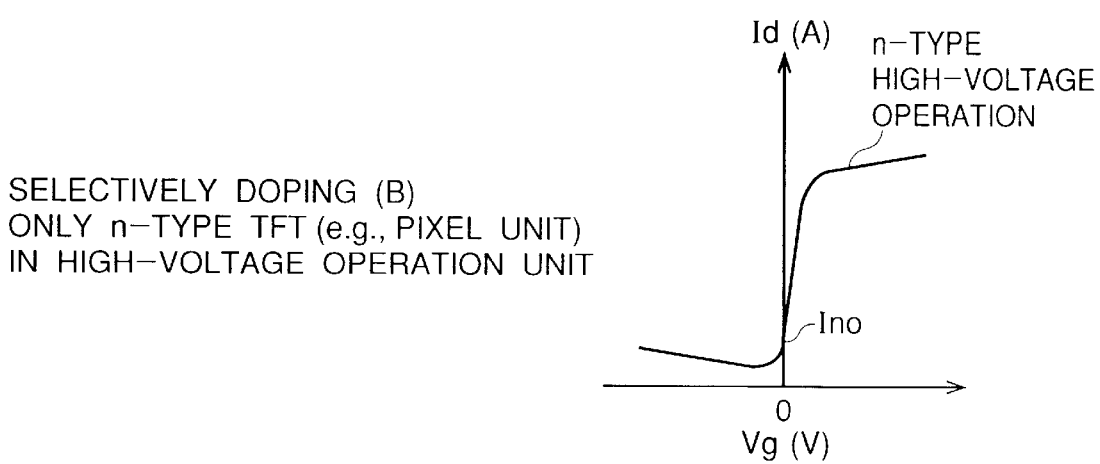

Subsequently, selectively doping with p-type impurity (B) is performed only for the prospective region of the n-type TFT of the high-voltage operation CMOS-TFT and the prospective region of the pixel TFT 221. This selective doping process is carried out at a dose of about 1 to $5 \times 10^{12}/cm^2$ with the DC ion-doping apparatus. FIG. 21A shows the Id-Vg curves of the high-voltage operation CMOS-TFT in this state. As shown in FIG. 21A, the Id-Vg curve of only the n-type TFT shifts in the positive direction from the state shown in FIG. 20A to adjust the threshold voltage (Vthn) to the specified value. With this, as shown in FIG. 21B, the Id-Vg curve of the pixel TFT 221 also shifts in the positive direction to adjust the threshold voltage (Vthn) to the specified value.

In the third embodiment as described above, in a liquid crystal display requiring a plurality of CMOS-TFTs (and, e.g., a pair of n-type TFTs) classified into at least two element groups having different operating voltages, predetermined numbers of times of non-selectively doping and selectively doping are combined, non-selectively doping is first performed for the whole structure including the two element groups, and non-selectively doping and selectively doping are sequentially performed for the element group having high-operation-voltage CMOS-TFTs. This eliminates complicated steps such as photolithography in case that threshold voltage control is individually performed for the two element groups. Additionally, the threshold voltages of p- and n-type TFTs of each CMOS-TFT forming each element group are adjusted. That is, the threshold voltages of p- and n-type TFTs of a CMOS-TFT in each element group can be independently adjusted to specified values with only a minimum necessary number of times of doping (and minimum necessary labor).

The modes of non-selectively doping and/or selectively doping change in accordance with the operating voltage of each element group, so various combinations are possible. For example, in this embodiment, both of non-selectively doping and selectively doping are performed in the liquid crystal display-manufacturing process as a whole. But, for a predetermined element group (in this embodiment, a high-voltage operation CMOS-TFT), a preferable result can be obtained only with a predetermined number of times of non-selectively doping as described above.

More specifically, for a CMOS-TFT in the low-voltage element group, it is possible to realize preferable low-voltage operation by decreasing the difference between the absolute values of Vthp and Vthn, i.e., ||Vthp|−|Vthn||. This achieves high-speed operation and low power consumption. For a CMOS-TFT in the high-voltage element group, low power consumption is realized by decreasing (and substantially equalizing) Ip0 and In0 because Ip0 and In0 have large influence on an increase in the power consumption. For the pixel TFT 221, a signal charge leakage of the pixel cell 215 is prevented by decreasing the OFF current, and thereby crosstalk is prevented and high image quality is realized.

Figure 22:
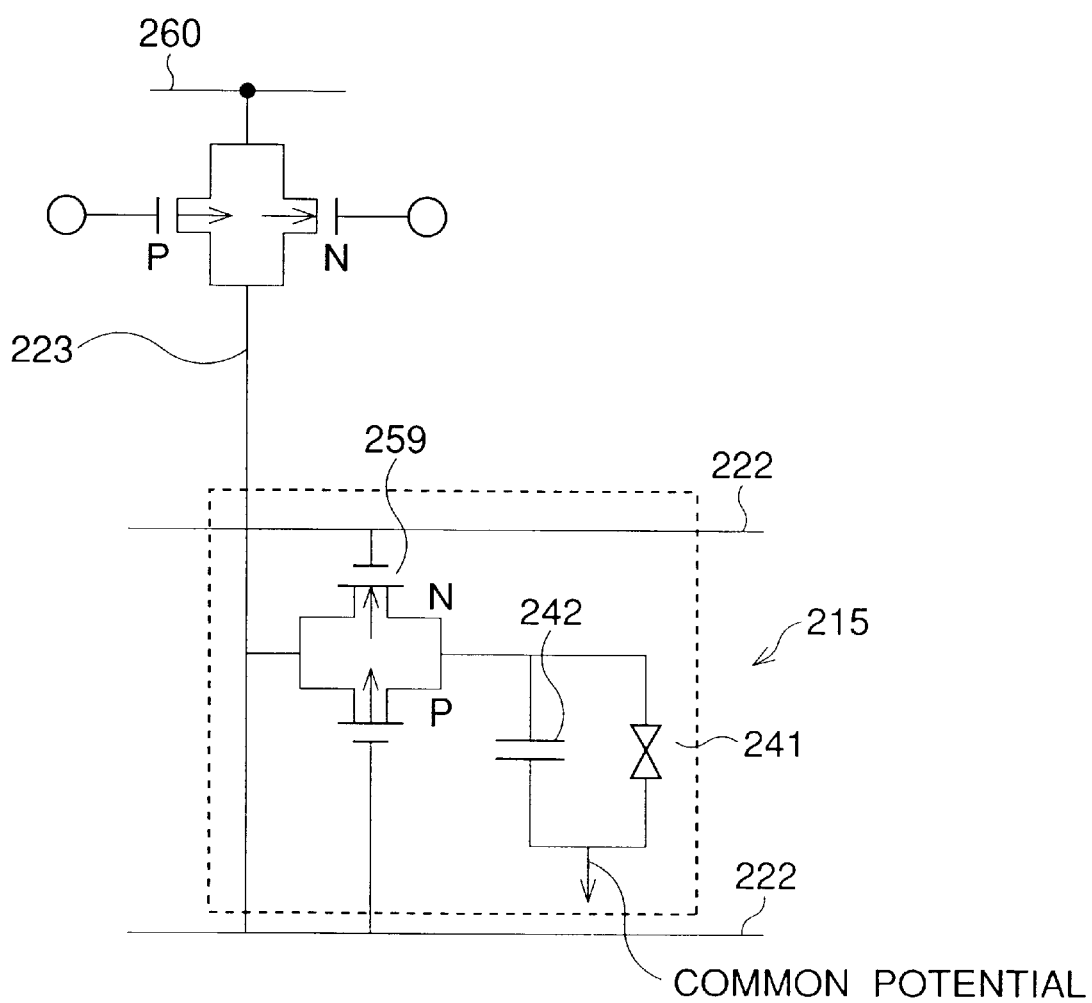
FIG. 22 is a circuit diagram showing the major components of a pixel cell of the liquid crystal display.

Note that a high-voltage operation CMOS-TFT can be used instead of the pixel TFTs 221. FIG. 22 shows a more improved arrangement of the pixel cell 215. In the pixel cell 215 shown in FIG. 22, a CMOS-TFT 259 is formed in place of the pixel TFTs 221 of the pixel cell 251 shown in FIG. 14.

When the present invention is applied to this CMOS-TFT 259, the absolute values of the threshold voltages of n- and p-type TFTs constructing the CMOS-TFT 259 can be made substantially equal to each other, and the zero currents Ip0 and In0 can be minimized.

When the pixel TFT 221 is an n-type TFT, a negative voltage must be applied to the gate of the n-type TFT in order to minimize the zero current In0 while the pixel TFT 221 is OFF. But, the zero currents Ip0 and In0 can be minimized when the CMOS-TFT 259 is used instead of the pixel TFTs and the present invention is applied as shown in FIG. 22. Besides, since no negative voltage needs to be applied to the gate any longer, the circuit configuration can be further simplified.

Besides, the CMOS-TFT 259 and the analog switch 220 at the end of the signal line 223 have the same configuration, so the CMOS-TFT 259 and the analog switch 220 can be readily synchronized with each other.

Modification

A modification of the third embodiment will be described below with reference to FIGS. 23A and 23B. In this modification, the liquid crystal display 201 described above is applied to a rear projection panel 231.

Figure 23A:
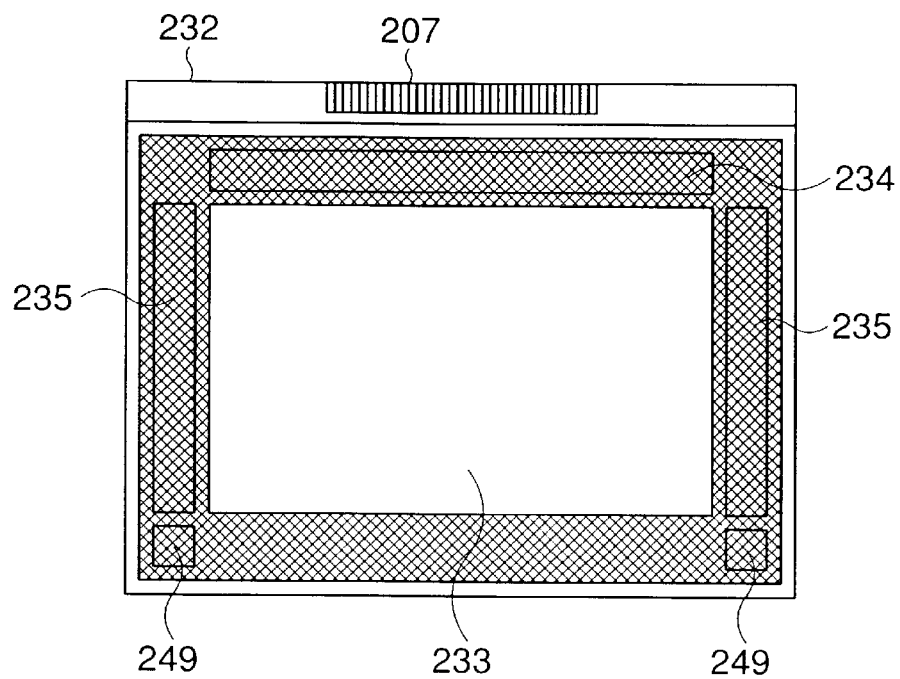
FIGS. 23A and 23B are schematic plan views showing the main parts of a liquid crystal display according to a modification of the third embodiment.
Figure 23B:
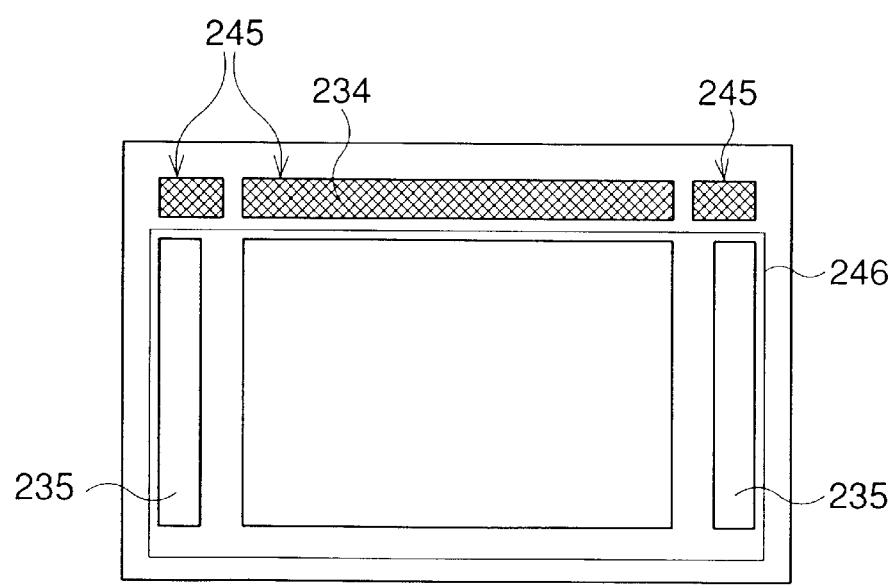

As shown in FIG. 23A, this rear projection panel 231 comprises a display unit 233, a signal-driving circuit 234, a gate-driving circuit 235, and an extracting terminal 207, all of which are formed on a TFT substrate 232.

Also in this modification, the operating frequencies of the signal-driving circuit 234 and other control circuits (e.g., an interface and a CPU) are high, so high-performance CMOS-TFTs with high mobility are necessary. For this reason, as shown in FIG. 23B, a crystal catalyst such as nickel (Ni) is added to predetermined portions of a semiconductor active layer in a high-speed operation circuit region to form Ni-added regions 245. This crystal catalyst promotes the crystallization of amorphous silicon. Since the crystallization of silicon is thereby improved, high-speed operation TFTs can be formed. A region except for the high-speed operation circuit region is left as an Ni-unadded region 246 without adding nickel.

As the crystal catalyst, it is also possible to use, e.g., cobalt (Co), platinum (Pt), Cu (copper), or iron (Fe) instead of nickel (Ni).

In this modification, a transparent electrode (e.g., ITO) in case of a display device of transmission type or a reflecting electrode (e.g., Al) in case of a display device of reflection type can be used as a pixel electrode.

In this modification, the threshold voltages of CMOS-TFTs in each portion are adjusted to optimum values (specified values) by the threshold voltage control method similar to that of the third embodiment. As a result, not only the panel performance improves but also no local heat generation occurs due to shifts of the threshold voltages. Since this prevents progressive deterioration, the reliability as a liquid crystal panel greatly improves.

What is claimed is:

1. A method of fabricating a CMOS device in which p- and n-type thin film transistors are formed, comprising the steps of:

non-selectively doping the whole of a thin film with p-type impurities, said thin film to be an active semiconductor layer including prospective regions to form said p- and n-type thin film transistors;

selectively doping only the prospective region to form said n-type thin film transistor with p-type impurities at a higher concentration than that in said step of non-selectively doping;

annealing said thin film to activate the p-type impurities contained therein;

forming a gate insulating film pattern on at least a portion of said prospective regions for forming said p- and n-type thin film transistors after said non-selective doping step or said selective doping step; and forming element structures in said thin film after said nonselective doping step or said selective doping step, each of said structures including a gate electrode pattern and source/drain patterns which are separated from said gate electrode pattern by said gate insulating film pattern, wherein threshold voltages of said p- and n-type thin film transistors are independently set by said step of non-selectively doping and said step of selectively doping.

2. A method according to claim 1, wherein said step of non-selectively doping is performed such that said thin film has a concentration distribution of p-type impurities substantially uniform in a direction of thickness of said thin film, and said step of selectively doping is performed such that said thin film has a concentration distribution of p-type impurities with a peak near a surface in the direction of thickness of said thin film.

3. A method according to claim 1, wherein said step of non-selectively doping is performed such that said thin film has a concentration distribution of p-type impurities substantially changing broadly in a direction of thickness of said thin film, and said step of selectively doping is performed such that said thin film has a concentration distribution of p-type impurities with a peak near a surface in the direction of thickness of said thin film.

4. A method according to claim 1, wherein said step of non-selectively doping is performed by one of processes selected from gas addition and ion-doping when said thin film is formed, and said step of selectively doping is performed by an ion-doping process.

5. A method according to claim 4, wherein said ion-doping process is performed by using a non-mass separation type ion-doping apparatus having a DC filament ion source.

6. A method according to claim 1, wherein the concentration of p-type impurities in said thin film is adjusted to not more than $1\times10^{18}/cm^3$ by said step of non-selectively doping.

7. A method according to claim 4, wherein the dose of said ion-doping process in said step of non-selectively doping is within the range of $1\times10^{11}/cm^2$ to $1\times10^{13}/cm^2$.

8. A method according to claim 4, wherein the gas amount of said gas addition process in said non-selectively doping is within the range of 1 to 10 ppm.

9. A method according to claim 1, wherein said thin film is an amorphous silicon film, said method comprises a step of crystallizing said amorphous silicon film by irradiation with a laser beam to form a polysilicon film, after said step of non-selectively doping, and said step of selectively doping is performed for said polysilicon film.

10. A method according to claim 1, wherein said method further comprises a step of crystallizing an amorphous silicon film by irradiation with a laser beam to form a polysilicon film, and said step of non-selectively doping is performed by using said polysilicon film as said thin film.

11. A method according to claim 1, further comprising a step of separating said thin film into islands of said prospective regions to form said p- and n-type thin film transistors, after said step of selectively doping.

12. A method according to claim 1, wherein said method further comprises a step of separating said thin film into islands of said prospective regions to form said p- and n-type thin film transistors, after said step of non-selectively doping, and said step of selectively doping is performed after said step of separating.

13. A method according to claim 12, wherein said gate insulating film pattern is formed on said islands of said prospective regions and said gate electrode regions are successively formed on said gate insulating film pattern, and said step of selectively doping is performed on condition that p-type impurities penetrate said gate electrode patterns and said gate insulating film and stop in portions of said islands regions immediately below said gate electrode patterns.

14. A method according to claim 12, wherein said method comprises:

a step of forming said gate insulating film patterns and said gate electrode patterns on said islands separated from said thin film after said step of non-selectively doping, such that said islands, said gate insulating film patterns, and said gate electrode patterns narrow down in this order;

said step of selectively doping in the state that only the island to be n-type is exposed, on condition that p-type impurities penetrate the corresponding gate electrode pattern and gate insulating film pattern and stop in a portion of said island immediately below said gate electrode pattern;

a step of performing doping with n-type impurities at a higher concentration than that in said step of selectively doping, in the state that only said island to be n-type is exposed, on condition that n-type impurities penetrate exposed portions of said gate insulating film pattern and stop in portions of said island region corresponding to said exposed portions of said gate insulating film pattern and further performing doping with n-type impurities at a still higher concentration such that n-type impurities stop in exposed portions of said island; and a step of doping with p-type impurities at a higher concentration than that in said step of selectively doping, in the state that only the island to be p-type is exposed, such that p-type impurities penetrate exposed portions of the corresponding gate insulating film pattern and stop in portions of said island corresponding to said exposed portions of said gate insulating film pattern and further doping with p-type impurities at a still higher concentration such that p-type impurities stop in exposed portions of said island.

15. A method according to claim 12, wherein said method comprises:

a step of forming said gate insulating film patterns and said gate electrode patterns on said islands separated from said thin film after said step of non-selectively doping, such that said islands, said gate insulating film patterns, and said gate electrode patterns narrow down in this order;

a step of doping the whole of said islands, said gate insulating film patterns and said gate electrode patterns with p-type impurities at a higher concentration than that in said step of selectively doping, on condition that p-type impurities penetrate exposed portions of said gate insulating film patterns and stop in portions of said islands corresponding to said exposed portions of said gate insulating film patterns and further doping said whole with p-type impurities at a still higher concentration such that p-type impurities stop in exposed portions of said islands;

said step of selectively doping in the state only the island to be n-type is exposed, on condition that p-type impurities penetrate the corresponding gate electrode pattern, and gate insulating film pattern and stop in portions of said island immediately below said gate electrode pattern; and a step of doping with n-type impurities in the state that only said island to be n-type is exposed, on condition that n-type impurities penetrate exposed portions of the corresponding gate insulating film pattern and stop in portions of said island corresponding to said exposed portions of said gate insulating film pattern, at a concentration at which said portions of said island can become n-type, and further doping with n-type impurities such that n-type impurities stop in exposed portions of said island at a concentration at which said exposed portions of said island can become n-type.

16. A method of fabricating a semiconductor device including a plurality of CMOS transistors each of which comprises p- and n-type thin film transistors and which are classified into at least two element groups having different operating voltages, said method comprising the steps of:

non-selectively doping a thin film with p-type impurities, said thin film to be an active semiconductor layer including first prospective regions to form p-type thin film transistors and second prospective regions to form n-type thin film transistors;

selectively doping only said second prospective regions of said thin film with p-type impurities at a higher concentration than that in said step of non-selectively doping;

annealing said thin film to activate the p-type impurities contained therein;

forming an insulating film on at least a portion of said prospective regions for forming said p- and n-type thin film transistors after said non-selective doping step or said selective doping step; and forming element structures in said thin film after said steps of non-selectively and selectively doping, each of said structures including a gate electrode and source/drain regions which is separated from said gate electrode by said insulating film, wherein each of said element groups is subjected to a predetermined number of times of said step of non-selectively doping necessary for the element group and a predetermined number of times of said step of selectively doping necessary for the element group so that threshold voltages of the p- and n-type thin film transistors constituting the element group are independently set in accordance with the operating voltage of the element group.

17. A method of fabricating a semiconductor device including a plurality of CMOS transistors each of which comprises p- and n-type thin film transistors and which are classified into at least two element groups having different operating voltages, said method comprising the steps of:

non-selectively doping a thin film with p-type impurities, said thin film to be an active semiconductor layer including first prospective regions to form p-type thin film transistors and second prospective regions to form n-type thin film transistors;

selectively doping only said second prospective regions of said thin film with p-type impurities at a higher concentration than that in said step of non-selectively doping;

annealing said thin film to activate the p-type impurities contained therein;

forming an insulating film on at least a portion of said prospective regions for forming said p- and n-type thin film transistors after said non-selective doping step or said selective doping step; and forming element structures in said thin film after said non-selective step or said selective doping step, each of said structures including a gate electrode and source/drain regions which is separated from said gate electrode by said insulating film, wherein each of part of said element groups is subjected to a predetermined number of times of said step of non-selectively doping necessary for the element group and a predetermined number of times of said step of selectively doping necessary for the element group, and each of the other part of said element groups is subjected to only a predetermined number of times of said step of non-selectively doping necessary for the element group, so that threshold voltages of the p- and n-type thin film transistors constituting each of said element groups are independently set in accordance with the operating voltage of the element group.

18. A method according to claim 16, wherein said step of non-selectively doping is performed by one of processes selected from gas addition and ion-doping when said thin film is formed, and said step of selectively doping is performed by an ion-doping process.

19. A method according to claim 18, wherein said ion-doping process is performed by using a non-mass separation type ion-doping apparatus having a DC filament ion source.

20. A method according to claim 16, wherein the concentration of p-type impurities in said thin film is adjusted to not more than $1 \times 10^{18}/cm^3$ by said step of non-selectively doping.

* * * * *